(12) United States Patent
Chen et al.

(10) Patent No.: US 7,911,008 B2
(45) Date of Patent: Mar. 22, 2011

(54) SRAM CELL HAVING A RECTANGULAR COMBINED ACTIVE AREA FOR PLANAR PASS GATE AND PLANAR PULL-DOWN NFETS

(75) Inventors: Xiangdong Chen, Poughquag, NY (US); Shang-Bin Ko, Poughkeepsie, NY (US); Dae-Gyu Park, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 679 days.

(21) Appl. No.: 11/924,059

(22) Filed: Oct. 25, 2007

(65) Prior Publication Data

US 2009/0108372 A1    Apr. 30, 2009

(51) Int. Cl.
*H01L 27/088* (2006.01)
(52) U.S. Cl. ....................................... 257/392; 257/368
(58) Field of Classification Search .................. 257/392, 257/368
See application file for complete search history.

(56) References Cited

U.S. PATENT DOCUMENTS

| | | | |
|---|---|---|---|
| 6,506,676 B2 | 1/2003 | Park et al. | |
| 6,534,805 B1 * | 3/2003 | Jin .............................. | 257/206 |
| 6,642,132 B2 | 11/2003 | Cho et al. | |
| 6,768,179 B2 | 7/2004 | Cho et al. | |
| 6,909,137 B2 | 6/2005 | Divakaruni et al. | |
| 7,157,359 B2 | 1/2007 | Park et al. | |
| 7,675,124 B2 * | 3/2010 | Liaw .............................. | 257/390 |
| 2002/0086504 A1 | 7/2002 | Park et al. | |
| 2002/0123189 A1 | 9/2002 | Cha et al. | |
| 2006/0163631 A1 | 7/2006 | Chen et al. | |
| 2006/0228848 A1 | 10/2006 | Chan et al. | |
| 2006/0244075 A1 | 11/2006 | Chen et al. | |
| 2007/0020865 A1 | 1/2007 | Chen et al. | |
| 2007/0040225 A1 | 2/2007 | Yang | |
| 2007/0051996 A1 | 3/2007 | Chen et al. | |

* cited by examiner

*Primary Examiner* — Douglas M Menz
(74) *Attorney, Agent, or Firm* — Scully, Scott, Murphy & Presser, P.C.; H. Daniel Schnurmann

(57) ABSTRACT

A planar pass gate NFET is designed with the same width as a planar pull-down NFET. To optimize a beta ratio between the planar pull-down NFET and an adjoined planar pass gate NFET, the threshold voltage of the planar pass gate NFET is increased by providing a different high-k metal gate stack to the planar pass gate NFET than to the planar pull-down NFET. Particularly, a threshold voltage adjustment dielectric layer, which is formed over a high-k dielectric layer, is preserved in the planar pass gate NFET and removed in the planar pull-down NFET. The combined NFET active area for the planar pass gate NFET and the planar pull-down NFET is substantially rectangular, which enables a high fidelity printing of the image of the combined NFET active area by lithographic means.

11 Claims, 40 Drawing Sheets

US 7,911,008 B2

SRAM CELL HAVING A RECTANGULAR COMBINED ACTIVE AREA FOR PLANAR PASS GATE AND PLANAR PULL-DOWN NFETS

CROSS REFERENCE TO RELATED PATENT APPLICATIONS

This application is related to concurrently filed U.S. patent application Ser. No. 11/924,053 and U.S. patent application Ser. No. 11/924,045, all of common assignee, which cross-referenced applications are filed concurrently with the present application.

FIELD OF THE INVENTION

The present invention relates to semiconductor structures, and particularly to a static random access memory (SRAM) cell structure having a rectangular combined active area for a planar pass gate n-type field effect transistor (NFET) and a planar pull-down NFET, and methods of manufacturing the same.

BACKGROUND OF THE INVENTION

Conventional complementary metal-oxide-semiconductor (CMOS) devices offer higher on-current for n-type field effect transistors (NFETs) than for p-type field effect transistors (PFETs) having similar physical dimensions. This is, in general, due to higher electron mobility than hole mobility in most semiconductor materials. In the case of a silicon substrate having a (100) surface, the ratio of electron mobility to hole mobility is about 2. Correspondingly, semiconductor circuits have been designed to factor in the differences in the on-current per unit width of NFETs and PFETs.

Static random access memory (SRAM) is a memory device employing six transistors. SRAM cell design typically begins by picking the smallest PFET supported by a given technology for two pull-up PFETs, followed by scaling of NFET pass gate transistors and pull-down NFET transistors for optimal beta ratio, cell stability, and access time.

Referring to FIGS. 1A-1C, an exemplary prior art SRAM cell structure comprises a first planar pull-up PFET 116, a second planar pull-up PFET 116', two planar pull-down NFETs (114, 114'), and two planar pass gate NFETs (112, 112'). FIG. 1A is a top-down view of the exemplary SRAM cell up to the CA level not showing a middle-of-line (MOL) dielectric 170. FIG. 1B is a vertical cross-sectional view of the exemplary SRAM cell along the plane B-B' showing the MOL dielectric 170. FIG. 1C is a vertical cross-sectional view of the exemplary SRAM cell along the plane C-C' showing the MOL dielectric 170. Each of the transistors (112, 112', 114, 114', 116, 116') comprise a portion of the semiconductor substrate 110, a portion of a gate dielectric 130, a portion of gate electrodes 132, portions of gate spacers 134, portions of active area (AA) silicides 160, and a portion of gate top silicides 164.

The gate dielectric 130 may comprise a conventional semiconductor oxide based dielectric material such as silicon oxide or silicon nitride. Alternately, the gate dielectric 130 may comprises a high dielectric constant (high-k) material having a dielectric constant greater than 4.0, and typically greater than 7.0. The gate electrodes 132 may comprise a doped polycrystalline semiconductor material such as doped polysilicon. Alternately, the gate electrodes 132 may comprise a metal gate material known in the art.

A shallow trench isolation structure 120 physically separates the transistors (112, 112', 114, 114', 116, 116') and provides electrical isolation among the transistors (112, 112', 114, 114', 116, 116'). CA contact vias 176 and CA bars 178 are employed to provide electrical wiring among the transistors (112, 112', 114, 114', 116, 116'). One of the CA bars 178, which contacts one of the AA silicides 160 of the first planar pull-up PFET 116 as well as the gate top silicides 164 of the second planar pull-up PFET 116' as shown in FIG. 1B, provides electrical connection between the drain of the first planar pull-up PFET 116 and the gate of the second planar pull-up PFET 116'. Likewise, another CA bar 178 provides electrical connection between the drain of the second planar pull-up PFET 116' and the gate of the first planar pull-up PFET 116.

Each of the active areas for the planar pass gate NFETs (112, 112') has a first width W1, and each of the active areas for the planar pull-down NFETs (114, 114') has a second width W2. A beta ratio, which is the ratio of an on-current of each of the planar pull-down NFETs (114,114') to an on-current of each of the planar pass gate NFETs (112, 112'), is substantially the same as the ratio of the second width W2 to the first width W1. Typically, the planar pass gate NFETs (112, 112') and the planar pull-down NFETs (114, 114') have the same threshold voltage. It has been shown that the beta ratio needs to be close to 2.0 for optimal cell stability of an SRAM cell. Thus, the ratio of the second width W2 to the first width W1 is close to 2.0 in the exemplary prior art SRAM cell.

Referring to FIGS. 2A-2C, the exemplary SRAM cell is shown up to an M1 level, which is a first metal interconnect level. FIG. 2A is a top-down view of the exemplary SRAM cell up to the M1 level. The middle-of-line (MOL) dielectric 170 and an M1 dielectric 180 are not shown in FIG. 2A. FIG. 2B is a vertical cross-sectional view of the exemplary prior structure along the plane B-B' showing the MOL dielectric 170 and the M1 dielectric 180. FIG. 2C is a vertical cross-sectional view of the exemplary SRAM cell along the plane C-C' showing the MOL dielectric 170 and the M1 dielectric 180. M1 wires 188 embedded within the M1 dielectric 180 contact the underlying CA contact vias 176 and the CA bars 178. In the exemplary prior art SRAM cell, the drain of each of the two planar pull-up transistors (116, 116') is electrically connected to a node at which a source/drain of one of the planar pass gate transistors (112, 112') adjoins the drain of one of the planar pull-down NFETs (114, 114') by a combination of a CA bar 178, an M1 wire 188, and a CA contact via 176. Two such combinations are present in each SRAM cell structure which comprises six transistors (112, 112', 114, 114', 116, 116').

Referring to FIG. 3, a circuit schematic 118 for the exemplary prior art SRAM cell shows a first pair of a first pass gate n-type field effect transistor (NFET) 102 and a first pull-down n-type field effect transistor (NFET) 104. A first source/drain of the first pass gate NFET 102 and a first drain of the first pull down NFET 104 are adjoined to form an electrical connection. In the physical structure, this electrical connection is achieved by a first common active area that contains both the first source/drain of the first pass gate NFET 102 and the first drain of the first pull-down NFET 104. Similarly, a second source/drain of the second pass gate NFET 102' and a second drain of a second pull-down NFET 104' are adjoined to form another electrical connection. In the physical structure, this electrical connection is achieved by a second common active area that contains both the second source/drain of the second pass gate NFET 102' and the second drain of the second pull-down NFET 104'. The circuit schematic 118 further comprises a first pull-up p-type field effect transistor (PFET)

106 containing a third drain, which is physically a third active area, and a second pull-up PFET 106' containing a fourth drain, which is physically a fourth active area. Each of the source/drain nodes of the pass gate transistors (102, 102') may function as a source or a drain depending on the operation of the SRAM circuit.

The third active area is electrically connected to the first active area via a collection of a first contact via, a first M1 wire, and a first CA bar. This connection is represented in the circuit schematic 118 by a first internal node 111. Similarly, the fourth active area is electrically connected to the second active area via a collection of a second contact via, a second M1 wire, and a second CA bar. This connection is represented in the circuit schematic 118 by a second internal node 111'. The gates of the second pull-up PFET 106' and the second pull-down NFET 104' are adjoined to the third drain of the first pull-up PFET 106 via the first CA bar. This connection is represented in the circuit schematic 118 by a third internal node 113A and a fourth internal node 113B. The gates of the first pull-up PFET 106 and the first pull-down NFET 104 are adjoined to the fourth drain of the second pull-up PFET 106' via the first CA bar. This connection is represented in the circuit schematic 118 by a fifth internal node 113A' and a sixth internal node 113B'. The internal nodes (111, 111', 113A, 113B, 113A', 113B') are connected by CA contact vias 176 and CA bars 178 as well as M1 wires 188. Bit line wiring (115, 115') and word line wiring (117, 117') are typically implemented at M2 and M3 levels.

Dimensions of semiconductor devices continue to shrink as scaling of semiconductor device continues. As features sizes are reduced relative to the wavelength of lithography tools, which may be 193 nm for ArF excimer ultraviolet radiation or 157 nm for $F_2$ laser, optical proximity effects cause printing of a complex pattern difficult. Specifically, a jog in width in an area at which the second width W2 changes into the first width W1 causes rounding of edges and tapering of the width of the planar pass gate transistors (112, 112') and the pull-down transistors (114, 114'). Even optical proximity correction (OPC) tends to be unable to eliminate such rounded features, and consequent uncertainty of the width of the transistors under the gate electrodes 132. Thus, the change in the width of the combined active area of each of the planar pass gate transistors (112, 112') and one of the pull-down transistors (114, 114') adjoined thereto invariably causes adverse impacts on variability and/or predictability of the on-currents of the transistors, and consequently to the beta ratio and to SRAM cell stability.

In view of the above, there exists a need for an SRAM cell structure providing a stable beta ratio and high cell stability, and methods of manufacturing the same.

Further, there exists a need for an SRAM cell structure conducive to printing of an active area image of high optical fidelity with well defined width for the gate of pass transistors and pull-down transistors, and methods of manufacturing the same.

SUMMARY OF THE INVENTION

The present invention addresses the needs described above by providing a static random access memory cell structure having a rectangular combined active area for a pass gate n-type field effect transistor (NFET) and a pull-down NFET, and methods of manufacturing the same.

In the present invention, a planar pass gate NFET is designed with the same width as a pull-down NFET. To optimize a beta ratio between the pull-down NFET and an adjoined planar pass gate NFET, the threshold voltage of the planar pass gate NFET is increased by providing a different high-k metal gate stack to the planar pass gate NFET than to the pull-down NFET. Particularly, a threshold voltage adjustment dielectric layer, which is formed over a high-k dielectric layer, is preserved in the planar pass gate NFET and removed in the pull-down NFET. The high threshold voltage of the planar pass gate NFET provides less current per width than the pull-down NFET so that an SRAM cell achieves optimal beta value and stability. The combined NFET active area for the planar pass gate NFET and the pull-down NFET is substantially rectangular, which enables a high fidelity printing of the image of the combined NFET active area by lithographic means.

According to an aspect of the present invention, a static random access memory (SRAM) cell structure is provided, which comprises:

a planar pass gate n-type field effect transistor (NFET); and a planar pull-down NFET, wherein the planar pass gate NFET and the planar pull-down NFET are located on a common active semiconductor area having a substantially rectangular surface area, the common active semiconductor area being located in a semiconductor substrate.

In one embodiment, a ratio of a first on-current of the planar pull-down NFET to a second on-current of the planar pass gate NFET is from about 1.5 to about 2.5.

In another embodiment, a first gate stack of the planar pass gate NFET has a first work function and a second gate stack of the planar pull-down NFET has a second work function, wherein the first work function is greater than the second work function.

In even another embodiment, a level of the first work function is below a mind-band-gap level and a level of the second work function is above the mid-band-gap level in a band gap diagram.

In yet another embodiment, a first gate length of the planar pass gate NFET and a second gate length of the planar pull-down NFET are the same.

In still another embodiment, the SRAM cell structure further comprises a planar pull-up p-type field effect transistor (PFET), wherein a third gate length of the planar pull-up PFET is the same as the first gate length.

In still yet another embodiment, the planar pass gate NFET comprises a first gate stack and the planar pull-down NFET comprises a second gate stack, wherein the first gate stack comprises:

a first high dielectric constant (high-k) material portion comprising a high-k material having a dielectric constant greater than 4.0;

a metal containing dielectric portion vertically abutting the first high-k material portion and comprising a different material than the high-k material; and a first conductive metal nitride portion vertically abutting the metal containing dielectric portion and comprising a conductive metal nitride;

and wherein the second gate stack comprises:

a second high-k material portion comprising the high-k material; and a second conductive metal nitride portion vertically abutting the second high-k material portion and comprising the conductive metal nitride.

In a further another embodiment, the planar pass gate NFET comprises a second gate stack and the planar pull-down NFET comprises a first gate stack, wherein the first gate stack comprises:

a first high dielectric constant (high-k) material portion comprising a high-k material having a dielectric constant greater than 4.0;

a metal containing dielectric portion vertically abutting the first high-k material portion and comprising a different material than the high-k material; and a first conductive metal nitride portion vertically abutting the metal containing dielectric portion and comprising a conductive metal nitride;

and wherein the second gate stack comprises:

a second high-k material portion comprising the high-k material; and a second conductive metal nitride portion vertically abutting the second high-k material portion and comprising the conductive metal nitride.

In an even further embodiment, the SRAM cell structure further comprises a planar pull-up p-type field effect transistor (PFET) located on an active area of the semiconductor substrate and containing the same gate stack as first gate stack.

In a yet further embodiment, the SRAM cell structure further comprises a planar pull-up p-type field effect transistor (PFET) located on an active area of the semiconductor substrate and containing a third gate stack, the third gate stack comprising:

a third high-k material portion comprising the high-k material;

a second metal containing dielectric portion vertically abutting the third high-k material portion and comprising a same material as the metal containing dielectric portion; and a third conductive metal nitride portion vertically abutting the second metal containing dielectric portion and comprising the conductive metal nitride.

In a still further embodiment, the first gate stack further comprises a first polycrystalline semiconductor material portion vertically abutting the first conductive metal nitride portion and comprising a polycrystalline semiconductor material, and wherein the second gate stack further comprises a second polycrystalline semiconductor material portion vertically abutting the second conductive metal nitride portion and comprising the polycrystalline semiconductor material.

In a still yet further embodiment, the polycrystalline semiconductor material comprises doped silicon, a doped silicon germanium alloy, a doped silicon carbon alloy, or a doped silicon germanium carbon alloy.

In further another embodiment, the SRAM cell structure further comprises a planar pull-up p-type field effect transistor (PFET) located on an active area of the semiconductor substrate and containing a third gate stack, the third gate stack comprising:

a semiconductor oxide based gate dielectric portion comprising a semiconductor oxide or a semiconductor oxynitride;

a doped polycrystalline semiconductor material portion vertically abutting the semiconductor oxide based gate dielectric portion and comprising another polycrystalline semiconductor material; and a third polycrystalline semiconductor material portion vertically abutting the doped polycrystalline semiconductor material portion and comprising the polycrystalline semiconductor material.

According to another aspect of the present invention, a method of forming a static random access memory (SRAM) cell structure is provided. The method comprises:

forming a pair of first active semiconductor areas and a pair of second active semiconductor areas surrounded by a shallow trench isolation structure in a semiconductor substrate, wherein each of the pair of first active semiconductor areas has a substantially rectangular surface area and includes a pass gate n-type field effect transistor (NFET) area and a pull-down NFET area; and forming a planar pass gate NFET on the pass gate NFET area and a pull-down NFET on the pull-down NFET area.

In one embodiment, a ratio of a first on-current of the planar pull-down NFET to a second on-current of the planar pass gate NFET is from about 1.5 to about 2.5.

In another embodiment, a first work function of a first gate stack of the planar pass gate NFET is greater than a second work function of a second gate stack of the planar pull-down NFET.

In even another embodiment, the method further comprises forming a planar pull-up p-type field effect transistor (PFET), wherein a first gate length of the planar pass gate NFET, a second gate length of the planar pull-down NFET, and a third gate length of the planar pull-up PFET are the same.

In yet another embodiment, the pass gate NFET contains a first gate stack and the pull-down NFET contains a second gate stack, wherein the first gate stack includes a first conductive metal nitride portion comprising a conductive metal nitride and vertically abutting a metal containing dielectric portion, wherein the second gate stack includes a second conductive metal nitride portion comprising the conductive metal nitride and vertically abutting a high dielectric constant (high-k) material portion comprising a high-k material having a dielectric constant greater than 4.0, and wherein the metal containing dielectric portion comprises a different material than the high-k material.

In still another embodiment, the pass gate NFET contains a second gate stack and the pull-down NFET contains a first gate stack, wherein the first gate stack includes a first conductive metal nitride portion comprising a conductive metal nitride and vertically abutting a metal containing dielectric portion, wherein the second gate stack includes a second conductive metal nitride portion comprising the conductive metal nitride and vertically abutting a high dielectric constant (high-k) material portion comprising a high-k material having a dielectric constant greater than 4.0, and wherein the metal containing dielectric portion comprises a different material than the high-k material.

In still yet another embodiment, the method further comprises:

forming a high-k material layer comprising the high-k material on the semiconductor substrate;

forming a metal containing dielectric layer directly on the high-k material layer;

removing portions of the metal containing dielectric layer over the pull-down NFET areas, while preserving other portions of the metal containing dielectric layer over the pass gate areas; and forming a conductive metal nitride layer comprising the conductive metal nitride directly on the metal containing dielectric layer and the high-k material layer.

In a further embodiment, the method further comprises forming a planar pull-up p-type field effect transistor (PFET) on one of the second active semiconductor areas, wherein the pull-up PFET includes a third gate stack, the third gate stack containing a third conductive metal nitride portion comprising the conductive metal nitride and vertically abutting another metal containing dielectric portion comprising a same material as the metal containing dielectric portion.

In an even further embodiment, the method further comprises forming a planar pull-up p-type field effect transistor (PFET) on one of the second active semiconductor areas, wherein the pull-up PFET includes a gate stack having the same composition as pass gate NFET.

In a yet further embodiment, the method further comprises:

forming a stack on one of the second active semiconductor areas, wherein the stack includes a semiconductor oxide based gate dielectric portion comprising a semiconductor oxide or a semiconductor oxynitride and a doped polycrystalline semiconductor material portion vertically abutting the semiconductor oxide based gate dielectric portion and comprising a polycrystalline semiconductor material; and forming a polycrystalline semiconductor material layer on the stack and the conductive metal nitride layer.

BRIEF DESCRIPTION OF THE DRAWINGS

FIGS. 1A-2C show an exemplary prior art SRAM structure. FIGS. 1A-1C show the exemplary prior art SRAM structure up to a CA level. FIGS. 2A-2C show the exemplary prior art SRAM structure up to an M1 level. FIGS. 1A and 2A are top down views in which a middle-of-line (MOL) dielectric 170 and an M1 dielectric 180 are not shown. FIGS. 1B and 2B are vertical cross-sectional views of the exemplary prior art SRAM structure along the plane B-B' showing the MOL dielectric 170. FIGS. 1C and 2C are vertical cross-sectional views of the exemplary prior art SRAM structure along the plane C-C' showing the MOL dielectric 170 and the M1 dielectric 180.

" FIG. 1C is a vertical cross-sectional views along the plane C-C' of FIG. 10A.

" FIG. 17C is a vertical cross-sectional views along the plane C-C' of FIG. 17A.

DETAILED DESCRIPTION OF THE INVENTION

Figure 1A:
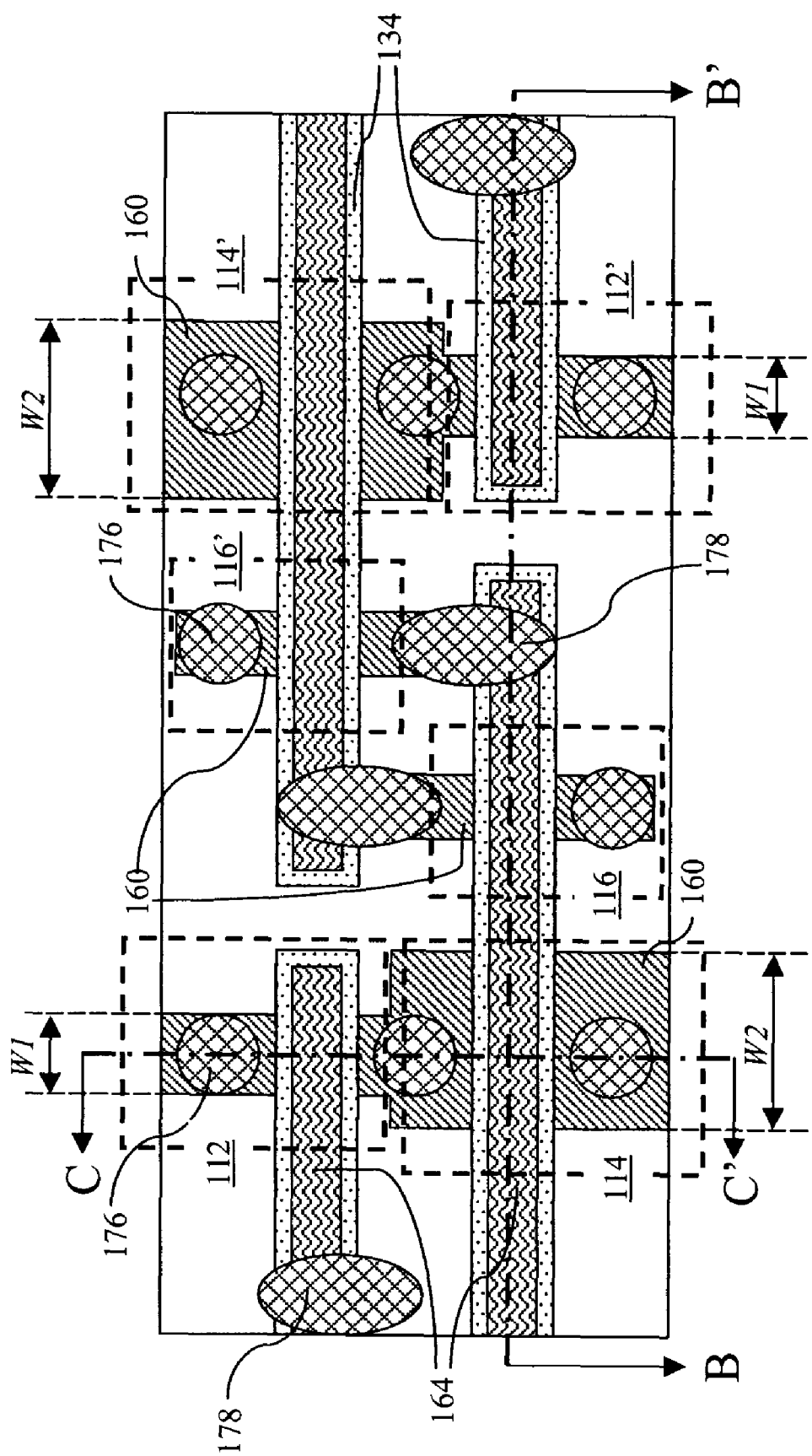
Figure 1B:
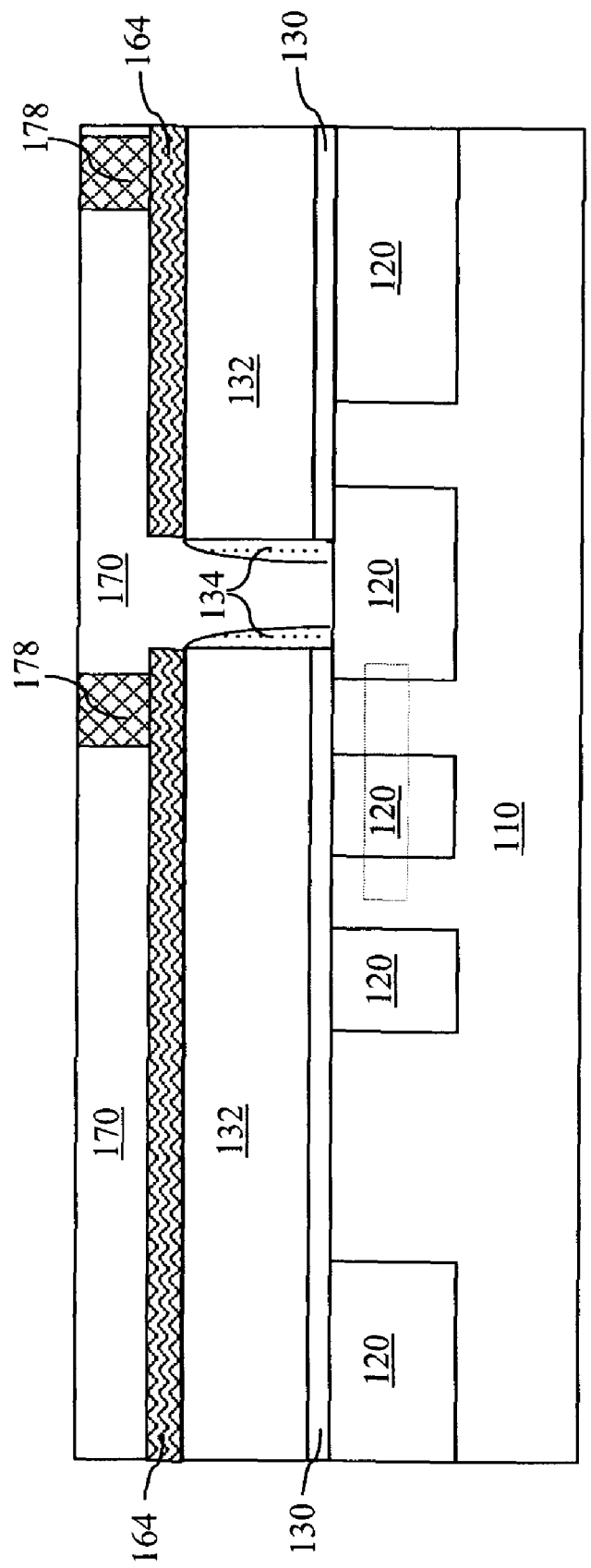
Figure 1C:
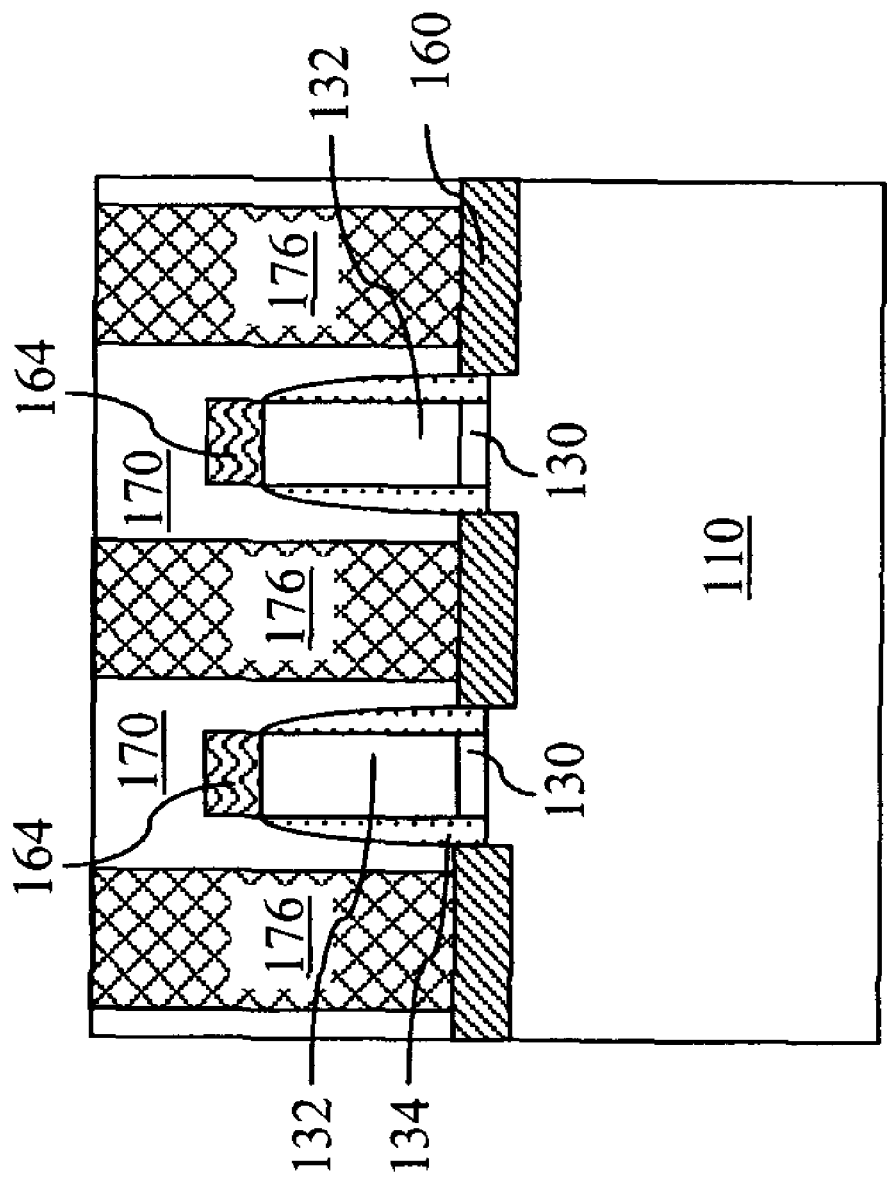
Figure 2A:
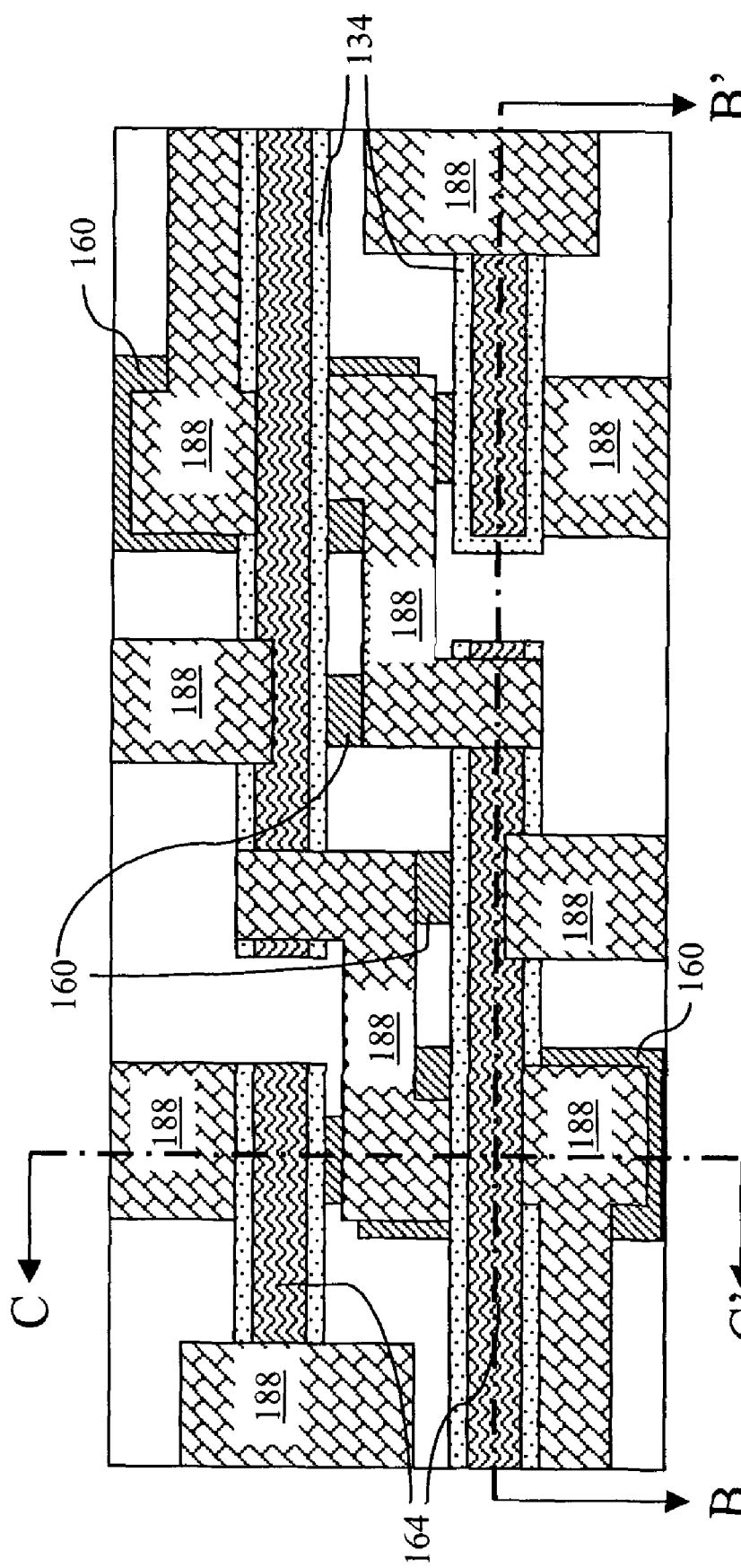
Figure 2B:
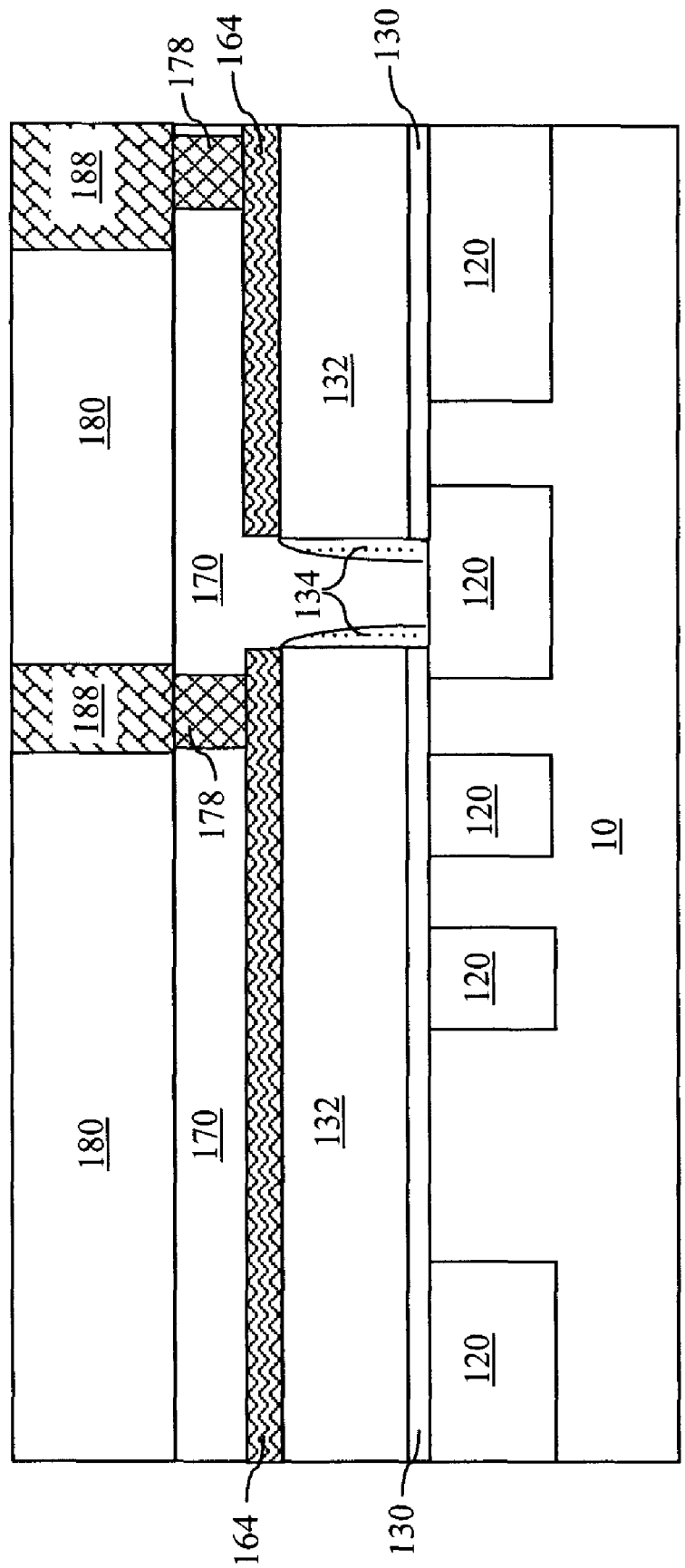
Figure 2C:
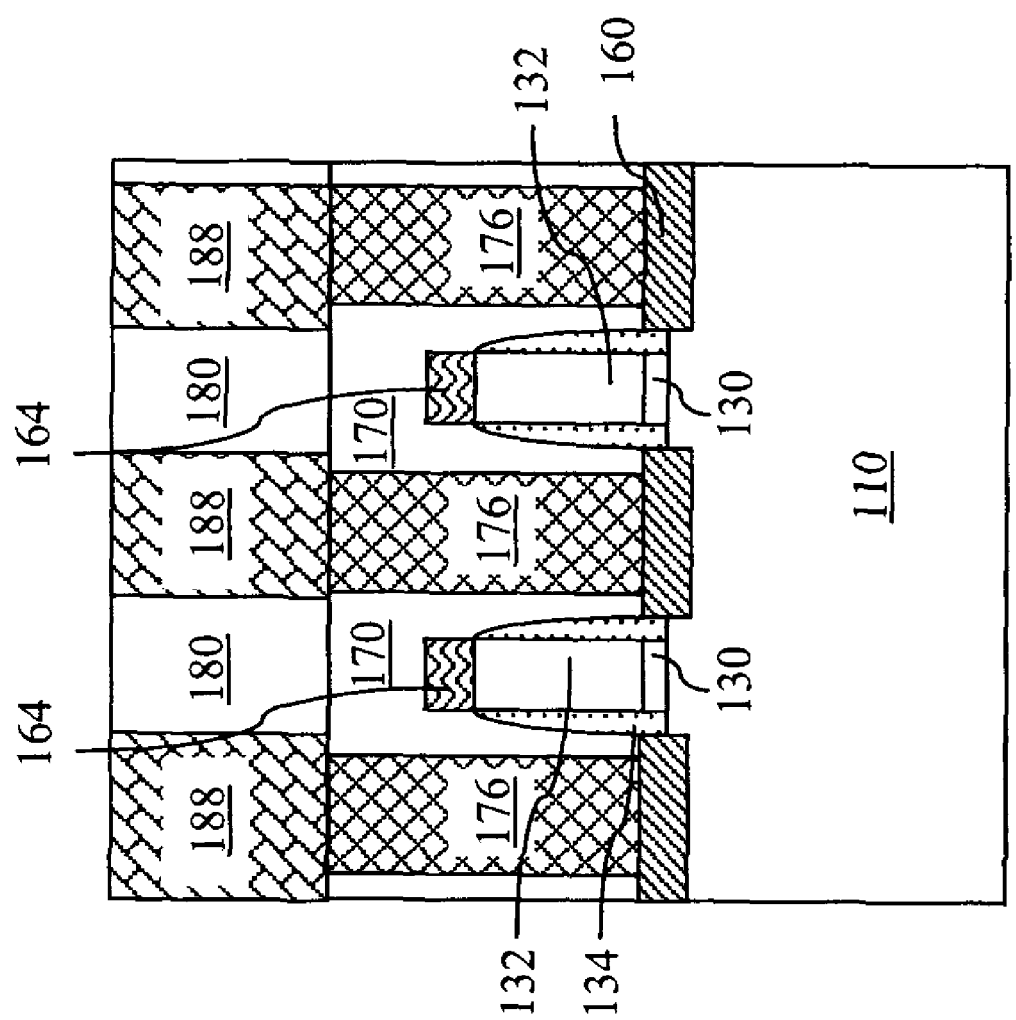
Figure 3:
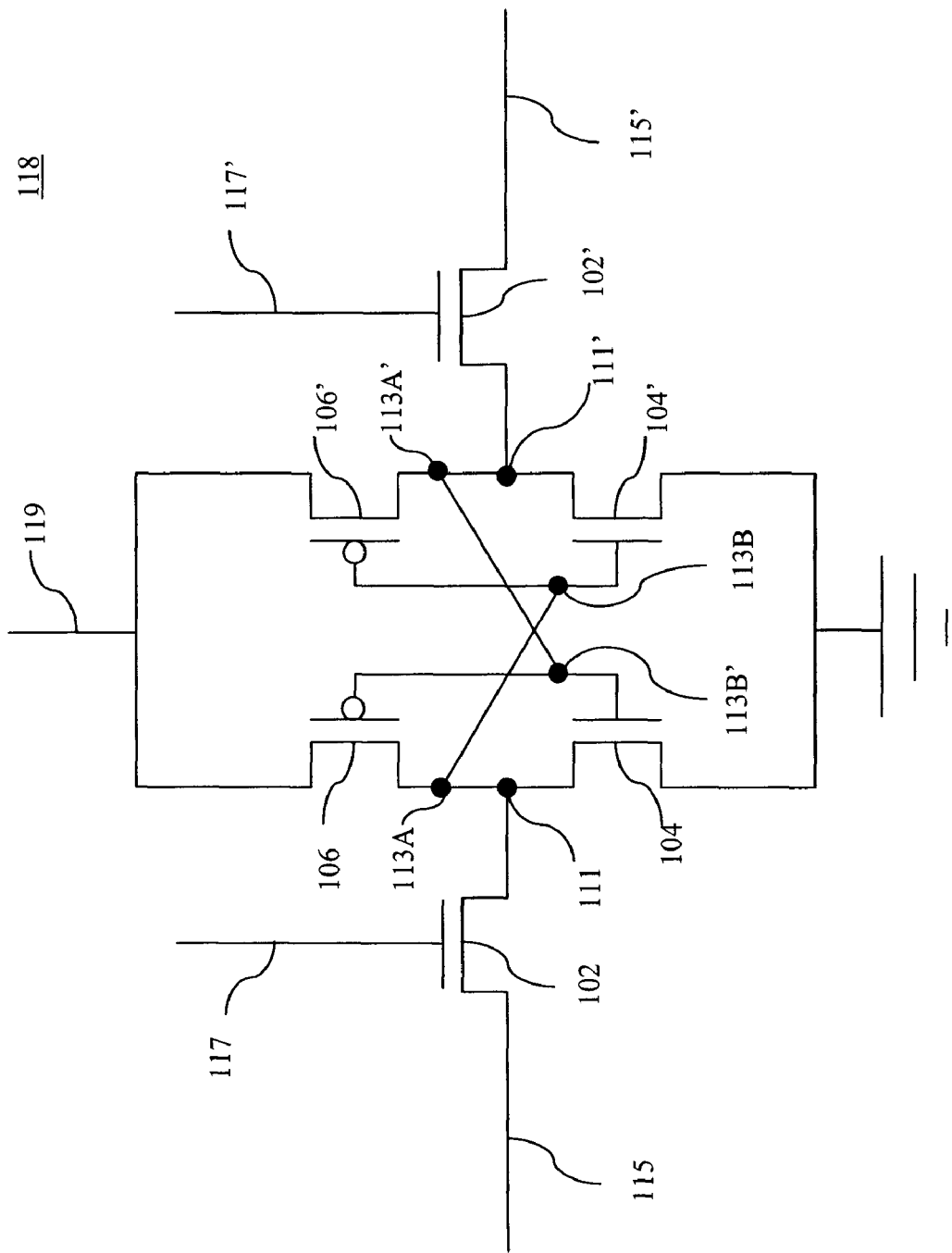
FIG. 3 is a circuit schematic for the exemplary SRAM structure.

As stated above, the present invention relates to a static random access memory (SRAM) cell structure having a rectangular combined active area for a planar pass gate n-type field effect transistor (NFET) and a planar pull-down NFET, and methods of manufacturing the same, which are now described in detail with accompanying figures. It is noted that like and corresponding elements mentioned herein and illustrated in the drawings are referred to by like reference numerals.

Figure 4A:
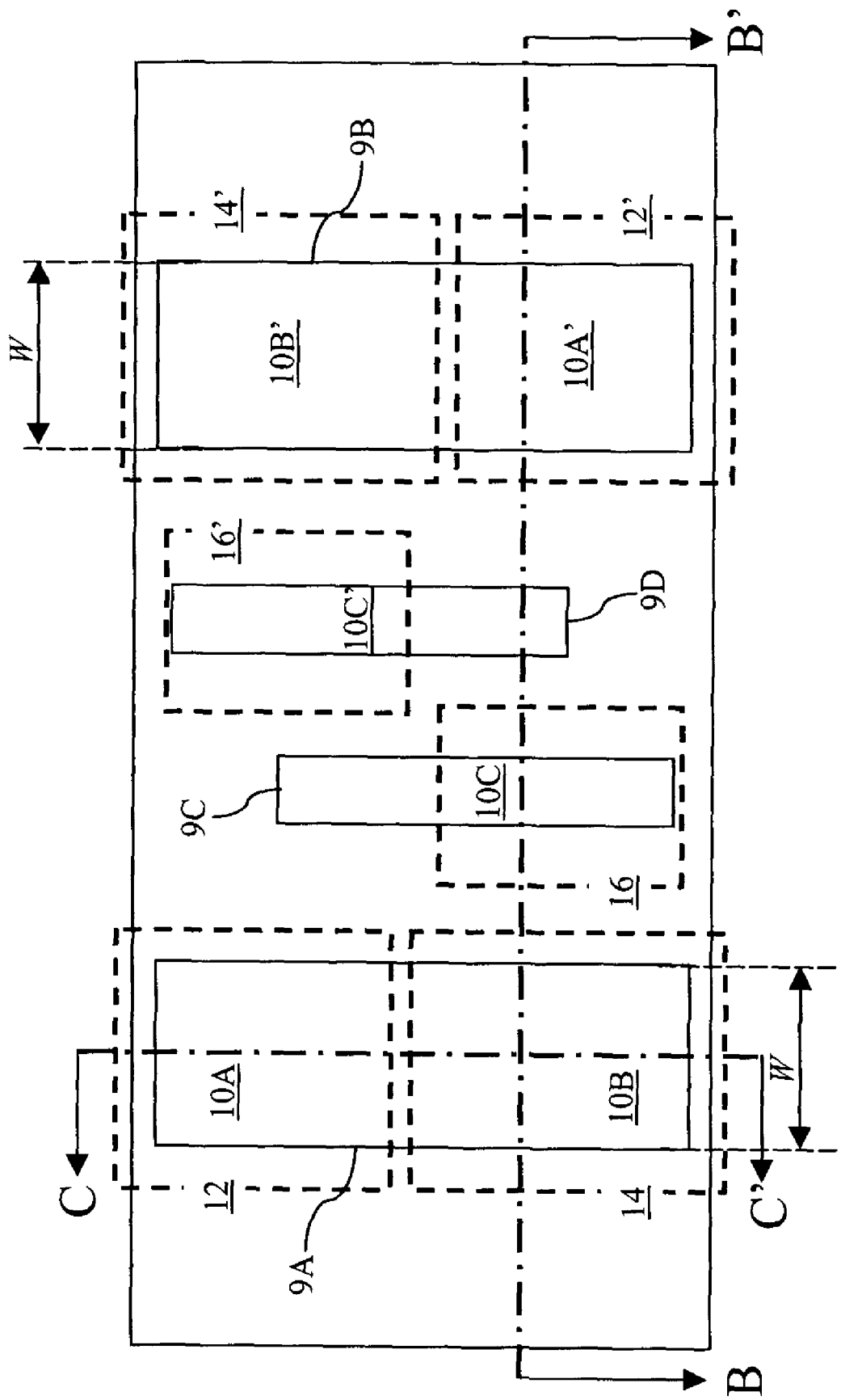
FIGS. 4A-10C are sequential views of a first exemplary semiconductor structure according to a first embodiment of the present invention. Figures with the same numeric label correspond to the same stage of a manufacturing process. Figures with the suffix "A" are top-down views. Figures with the suffix "B" are vertical cross-sectional views along the plane B-B' of the corresponding figure with the same numeric label and the suffix "A.
Figure 4B:
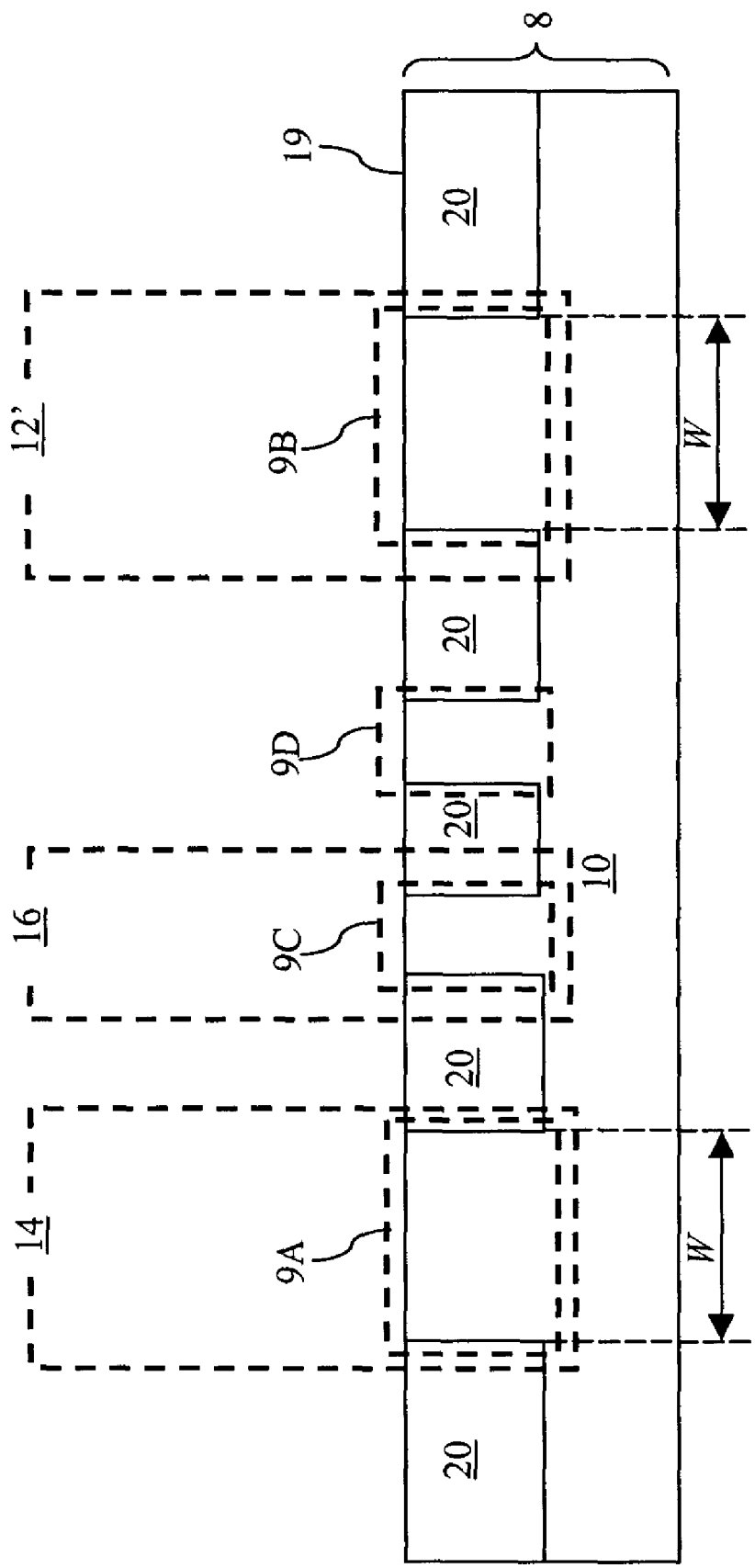

Referring to FIGS. 4A and 4B, a first exemplary semiconductor structure according to a first embodiment of the present invention comprises a semiconductor substrate 8 containing a semiconductor region 10 and at least one shallow trench isolation (STI) structure 20. The first exemplary semiconductor structure comprises a first pass gate n-type field effect transistor (NFET) region 12, a second pass gate NFET region 12', a first pull-down NFET region 14, a second pull-down NFET region 14', a first pull-up p-type field effect transistor (PFET) region 16, and a second pull-down PFET region 16'.

The first pass gate NFET region 12 and the first pull-down NFET region 14 are adjoined to each other and collectively include a primary first active semiconductor area 9A. The second pass gate NFET region 12' and the second pull-down NFET region 14' are adjoined to each other and collectively include a secondary first active semiconductor area 9A. The first pull-up PFET region 16 includes a portion of a primary second active semiconductor area 9C. The second pull-up PFET region 16' includes a portion of a secondary second active semiconductor region 9D. The primary first active semiconductor area 9A includes a first pass gate NFET area 10A and a first pull-down NFET area 10B. The first pass gate NFET area 10A and the first pull-down NFET area 10B are adjoined to each other and have a width W, which is constant throughout the entirety of the first pass gate NFET area 10A and the first pull-down NFET area 10B. Likewise, secondary first active semiconductor area 9B includes a second pass gate NFET area 10A' and a second pull-down NFET area 10B'. The second pass gate NFET area 10A' and the second pull-down NFET area 10B' are adjoined to each other and have the width W, which is constant throughout the entirety of the second pass gate NFET area 10A' and the second pull-down NFET area 10B'. Thus, each of the primary first active semiconductor area 9A and the secondary first active semiconductor area 9B is substantially rectangular, i.e., has a substantially rectangular surface area.

The portion of the primary second active semiconductor area 9C that belongs to the first pull-up PFET region 16 constitutes a first pull-up PFET area 10C. The portion of the secondary second active semiconductor area 9D that belongs to the second pull-up PFET region 16' constitutes a second pull-up PFET area 10C. Each of the various active semiconductor areas (9A-9D) refer to a portion of the semiconductor region 10 between the level of a substrate top surface 19, which is a top surface of the semiconductor substrate 8, and the level of a bottom surface of the at least one STI structure 20. Likewise, each of the pass gate NFET areas (10A, 10A'), the pull-down NFET areas (10B, 10B'), and the pull-up PFET areas (10C, 10C') refer to a portion of the semiconductor region 10 between the level of the substrate top surface 19 and the level of the bottom surface of the at least one STI structure 20. Top surfaces of the at least one STI structure 120 are substantially coplanar with top surfaces of the various active semiconductor areas (9A-9D). Embodiments in which processing steps induce height variations across the substrate top surface 19 are explicitly contemplated herein also.

The semiconductor region 10 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor region 10 is single crystalline, i.e., has the same crystallographic orientations throughout the volume of the semiconductor region 10. However, embodiments in which at least a portion of the semiconductor region 10 is polycrystalline, for example, in the case of thin film transistors (TFTs), are also explicitly contemplated herein.

The semiconductor substrate 8 may be a bulk substrate, a semiconductor-on-insulator (SOI) substrate, or a hybrid substrate having a bulk portion and an SOI portion. While the first embodiment is described with a bulk substrate, embodiments employing an SOI substrate or a hybrid substrate are explicitly contemplated herein.

The semiconductor region 10 may include at least one doped region, each having a p-type doping or an n-type doping. For clarity, the at least one doped region is not specifically shown in the drawing of the present application. Each of the at least one doped region is known as a "well" and may be formed utilizing conventional ion implantation processes.

Figure 5A:
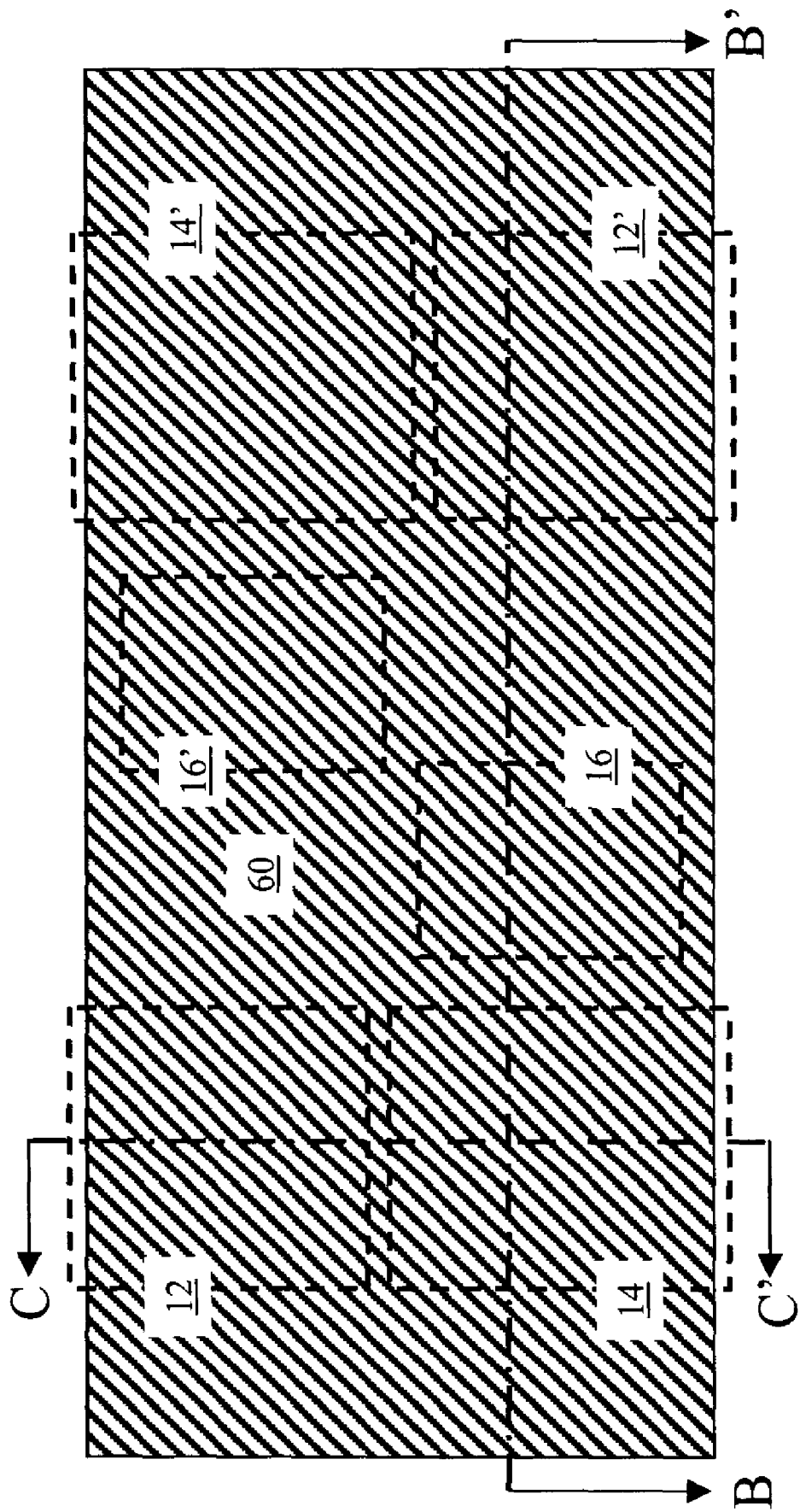
Figure 5B:
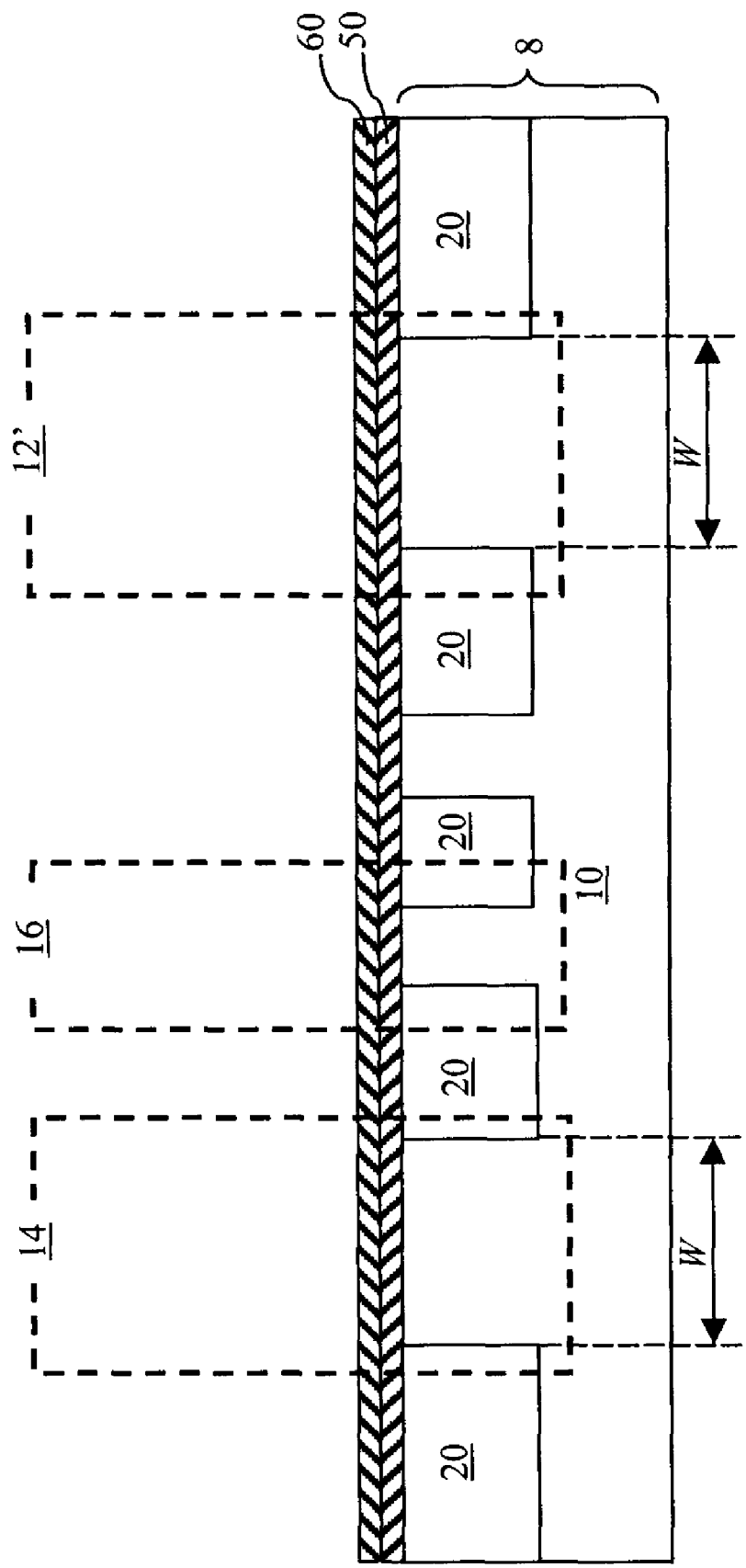

Referring to FIGS. 5A and 5B, a high dielectric constant (high-k) material layer 50 is formed on the exposed surfaces of the semiconductor substrate 8. The high-k material layer 50 comprises a high-k material having a dielectric constant greater than 4.0. Preferably, the high-k material has a dielectric constant greater than 7.0, and more preferably, the high-k dielectric material has a dielectric constant greater than 10.0.

Optionally, a chemical oxide layer (not shown) may be formed directly on exposed surfaces of the semiconductor region 10 prior to formation of the high-k material layer 50. When the semiconductor region 10 comprises a silicon containing semiconductor material, the chemical oxide layer comprises silicon oxide, silicon oxynitride or a nitrided silicon oxide. When the semiconductor region 10 comprises another semiconductor material than a Si-containing semiconductor, the chemical oxide layer may comprise a semiconducting oxide, a semiconducting oxynitride or a nitrided semiconducting oxide. The thickness of the chemical oxide layer is typically from about 0.5 to about 1.2 nm, with a thickness from about 0.8 to about 1 nm being more typical. The thickness, however, may be different after processing at higher temperatures, which are usually required during CMOS fabrication. In the case the chemical oxide layer is a silicon oxide layer having a thickness from about 0.6 to about 0.8 nm, the chemical oxide layer may be formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the chemical oxide layer can also be formed by treating the HF-last semiconductor surface in ozonated aqueous solutions, with the ozone concentration usually varying from, but not limited to: 2 parts per million (ppm) to 40 ppm.

The high-k material layer 50 is formed directly on the chemical oxide layer, if present, or directly on exposed surfaces of the first, second, and fourth semiconductor portions (10A, 100B, 10D) by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), atomic layer deposition (ALD), etc. The high-k material layer 50 comprises a dielectric metal oxide having a dielectric constant that is greater than the dielectric constant of silicon oxide of 4.0. The dielectric metal oxide is a high-k material containing a metal and oxygen, and is known in the art as high-k gate dielectric materials. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the high-k dielectric layer 40 may be from about 2 nm to about 6 nm, and may have an effective oxide thickness on the order of or less than 1 nm. The thickness and composition of the high-k material layer 50 are optimized to tune work functions of gate stacks to be subsequently formed, as will be discussed below.

A metal containing dielectric layer 60 is formed directly on the high-k material layer 50. The metal containing dielectric layer 60 may comprise a high-k material containing a metal and oxygen, known in the art as high-k gate dielectric materials. In this case, the metal containing dielectric layer 60 may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Non-stoichiometric variants are also contemplated herein. The metal containing dielectric layer 60 comprises a different material than the material of the high-k material layer 50.

Alternately, the metal containing dielectric layer 60 may comprise an alkaline earth metal-containing compound. Non-limiting examples of the alkaline earth metal-containing compound include MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, $BaI_2$, and an alloy thereof. Non-stoichiometric variants are also contemplated herein.

Yet alternately, the metal containing dielectric layer 60 may comprise a metal containing dielectric nitride such as AlN.

The metal containing dielectric layer 60 alters the work function of the high-k material layer 50, which affects threshold voltage of semiconductor devices. For this reason, the metal containing dielectric layer 60 is also referred to as a threshold voltage adjustment dielectric layer. The thickness of the metal containing dielectric layer 60 may be from about 0.1 nm to about 0.5 nm, although lesser and greater thicknesses are explicitly contemplated herein. The thickness and composition of the metal containing dielectric layer 60 are optimized to tune work functions of gate stacks to be subsequently formed, as will be discussed below.

Figure 6A:
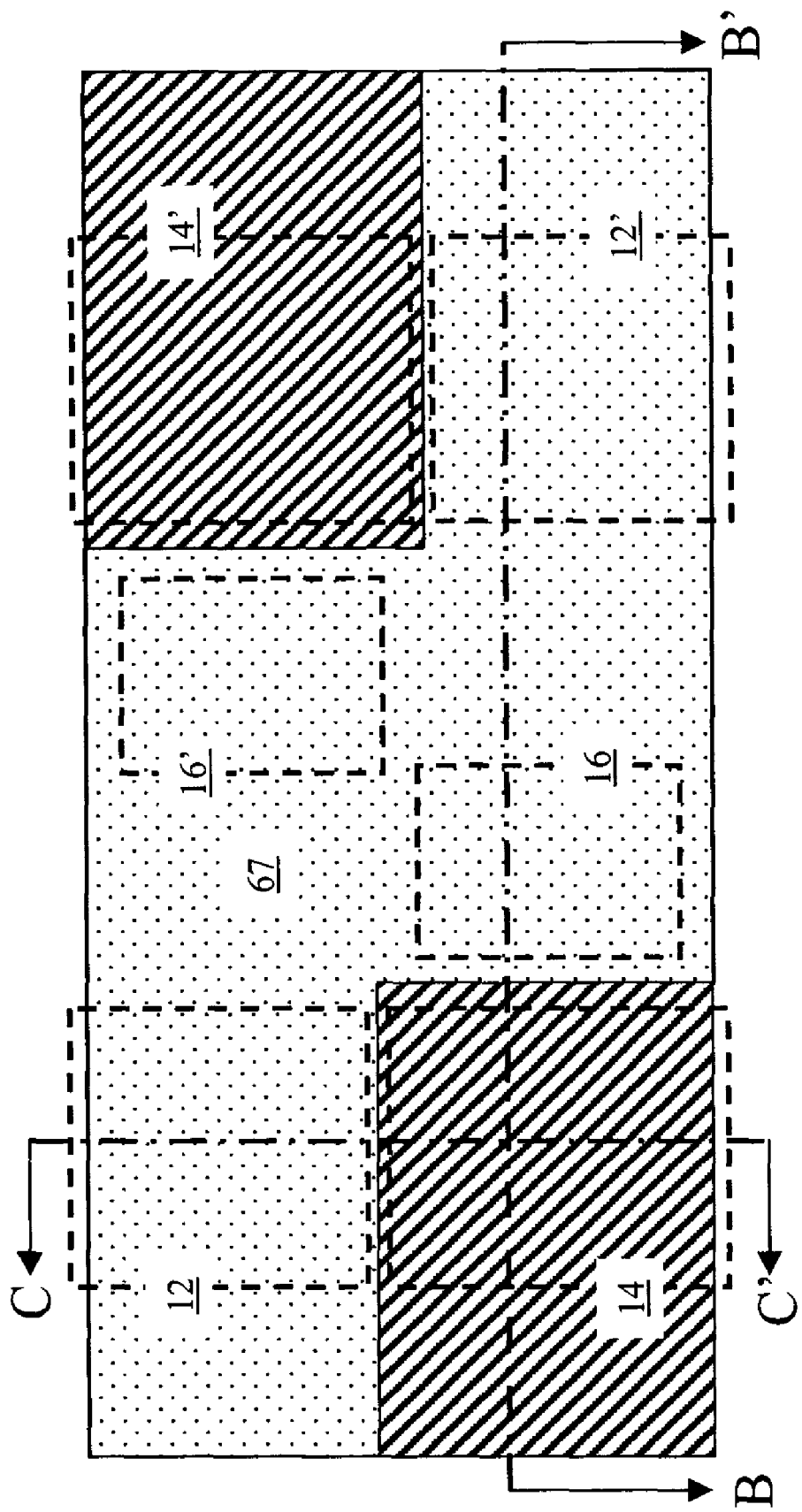
Figure 6B:
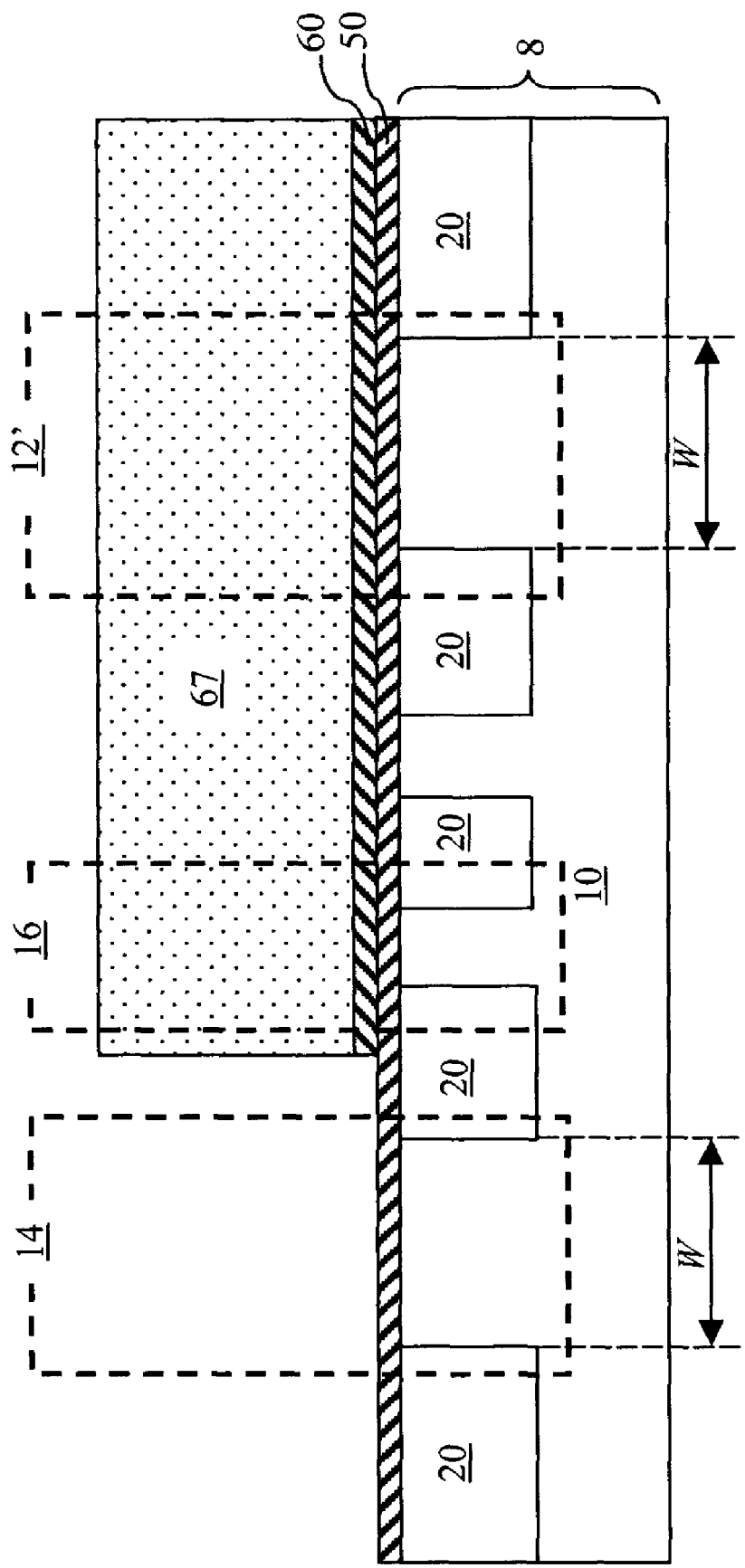

Referring to FIGS. 6A and 6B, a photoresist 67 is applied over the metal containing dielectric layer 60 and lithographically patterned to cover the metal containing dielectric layer 60 in the first and second pass gate NFET regions (12, 12') and the first and second pull-up PFET regions (16, 16'), while exposing the metal containing dielectric layer 60 in the first and second pull-down NFET regions (14, 14'). The exposed portions of the metal containing dielectric layer 60 in the first and second pull-down NFET regions (14, 14') are removed by an etch, which may be an isotropic etch such as a wet etch or an anisotropic etch such as a reactive ion etch. Preferably, the etch is selective to the high-k material layer 50. The metal containing dielectric layer 60 is preserved in the first and second pass gate NFET regions (12, 12') and the first and second pull-up PFET regions (16, 16'). The photoresist 67 is subsequently removed, for example, by ashing. A suitable surface clean such as a wet clean may be performed at this point.

Figure 7A:
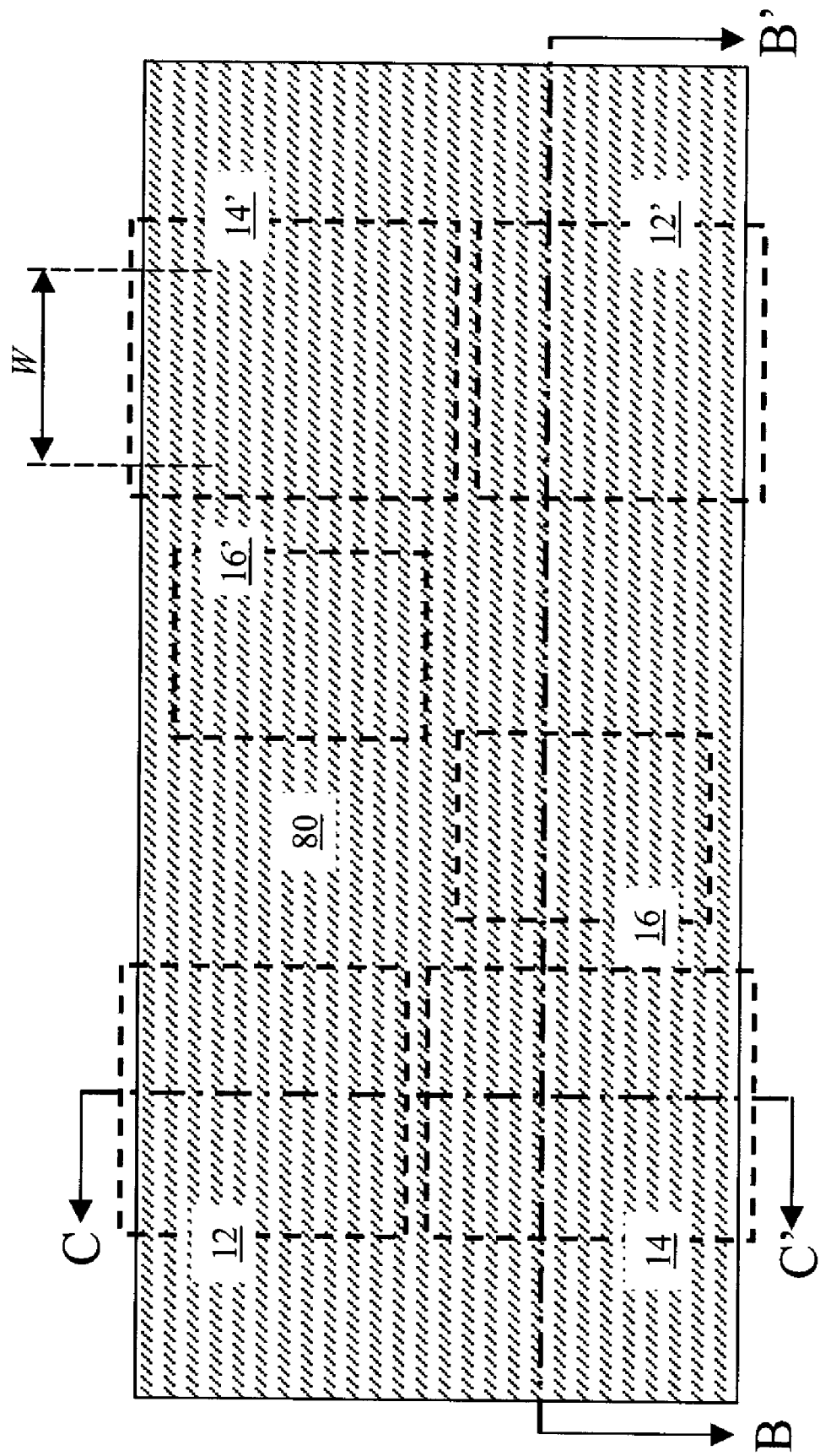
Figure 7B:
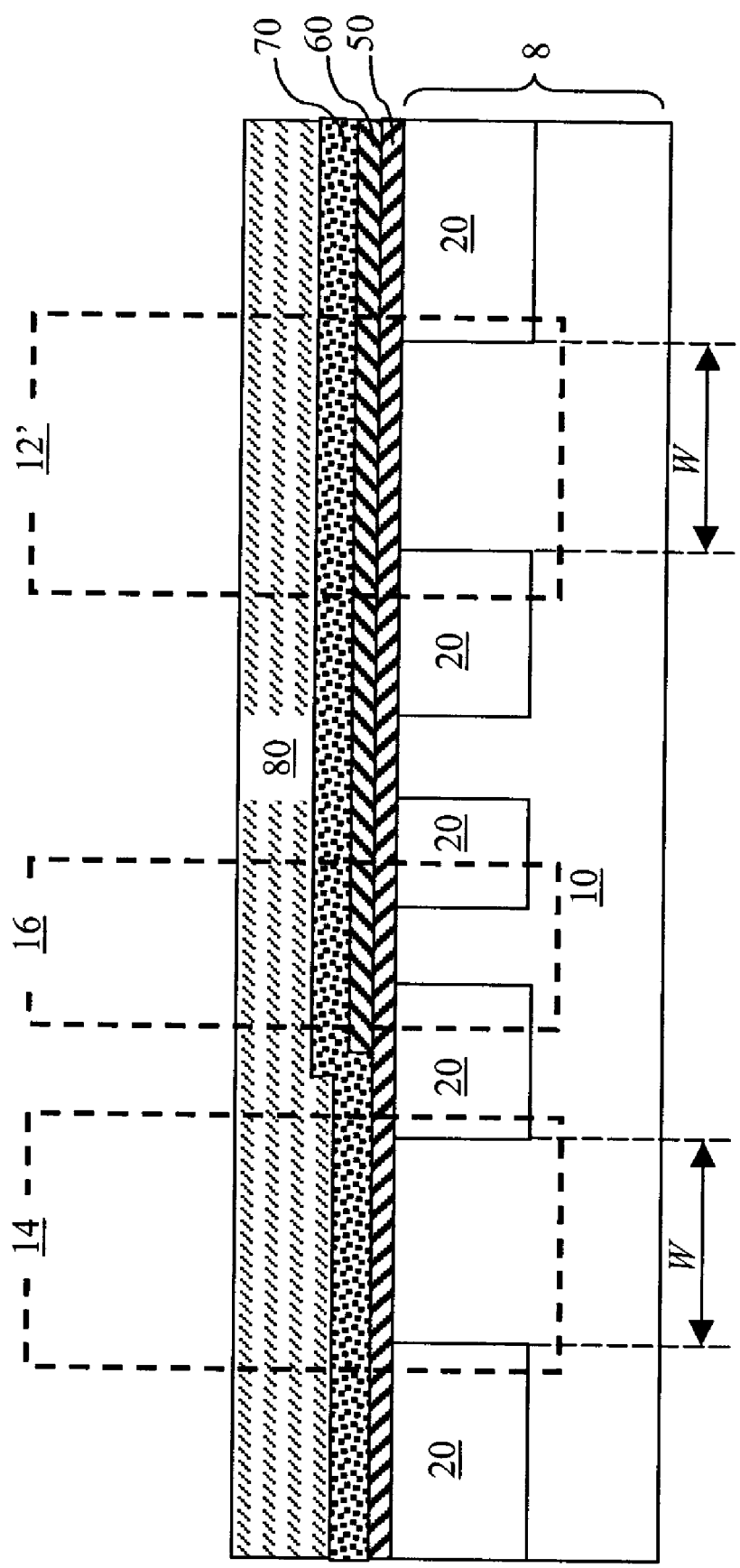

Referring to FIGS. 7A and 7B, a conductive metal nitride layer 70 is formed directly on the metal containing dielectric layer 60 and exposed portions of the high-k material layer 50. The conductive metal nitride layer 70 may comprise one of TiN, ZrN, HfN, VN, NbN, TaN, WN, TiAlN, TaCN, other conductive refractory metal nitrides, and an alloy thereof. The conductive metal nitride layer 70 may be formed by chemical vapor deposition (CVD), physical vapor deposition (PVD), atomic layer deposition (ALD), vacuum evaporation, etc. The conductive metal nitride layer 70 provides the functions of (a)

protecting the metal containing dielectric layer 60 and the high-k material layer 50 from the ambient, (b) blocking diffusion of ambient oxygen into the metal containing dielectric layer 60 and the high-k material layer 50, and (c) preventing reaction of the metal containing dielectric layer 60 and the high-k material layer 50 with a polycrystalline semiconductor material to be subsequently formed on the conductive metal nitride layer 70. The conductive metal nitride layer 70 may comprise a metal from Group IVB or VB of the Periodic Table of Elements or other transition metals. By way of example, the conductive metal nitride layer 70 preferably comprises TiN or TaN. The thickness of the conductive metal nitride layer 70 may be from about 2 nm to about 40 nm, and preferably from about 3 nm to about 20 nm.

The high-k material layer 50, the metal containing dielectric layer 60, and the conductive metal nitride layer 70 may be optimized such that the work function of a first stack of the high-k material layer 50, the metal containing dielectric layer 60, and the conductive metal nitride layer 70, which is herein referred to as a first work function $\Phi 1$, is between the conduction band edge and the balance band edge of the semiconductor material in the semiconductor region 10. The composition and thickness of each layer may be optimized for this purpose.

Further, the high-k material layer 50 and the conductive metal nitride layer 70 may be optimized such that the work function of the stack of the high-k material layer 50 and the conductive metal nitride layer 70, which is herein referred to as a second work function $\Phi 2$, is greater than the first work function $\Phi 1$.

Subsequently, a polycrystalline semiconductor material layer 80 is formed on a top surface of the conductive metal nitride layer 70. The polycrystalline semiconductor material layer 80 comprises a polycrystalline semiconductor material including at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. It is understood that an amorphous semiconductor material layer may be deposited and subsequently converted to the polycrystalline semiconductor material layer 80 in a thermal anneal. The polycrystalline semiconductor material layer 80 may be deposited with in-situ doping as a doped polycrystalline semiconductor material layer, or may be deposited as an undoped semiconductor material layer and subsequently doped by ion implantation. The thickness of the polycrystalline semiconductor material layer 80 may be from about 30 nm to about 150 nm, although lesser and greater thicknesses are herein explicitly contemplated also.

At this point, each of the first and second pass gate NFET regions (12, 12') and the first and second pull-up PFET regions (16, 16') comprise a stack of the high-k material layer 50, the metal containing dielectric layer 60, the conductive metal nitride layer 70, and the polycrystalline semiconductor material layer 80. Each of the first and second pull-down NFET regions (14, 14') comprises a stack of the high-k material layer 50, the conductive metal nitride layer 70, and the polycrystalline semiconductor material layer 80.

Figure 8A:
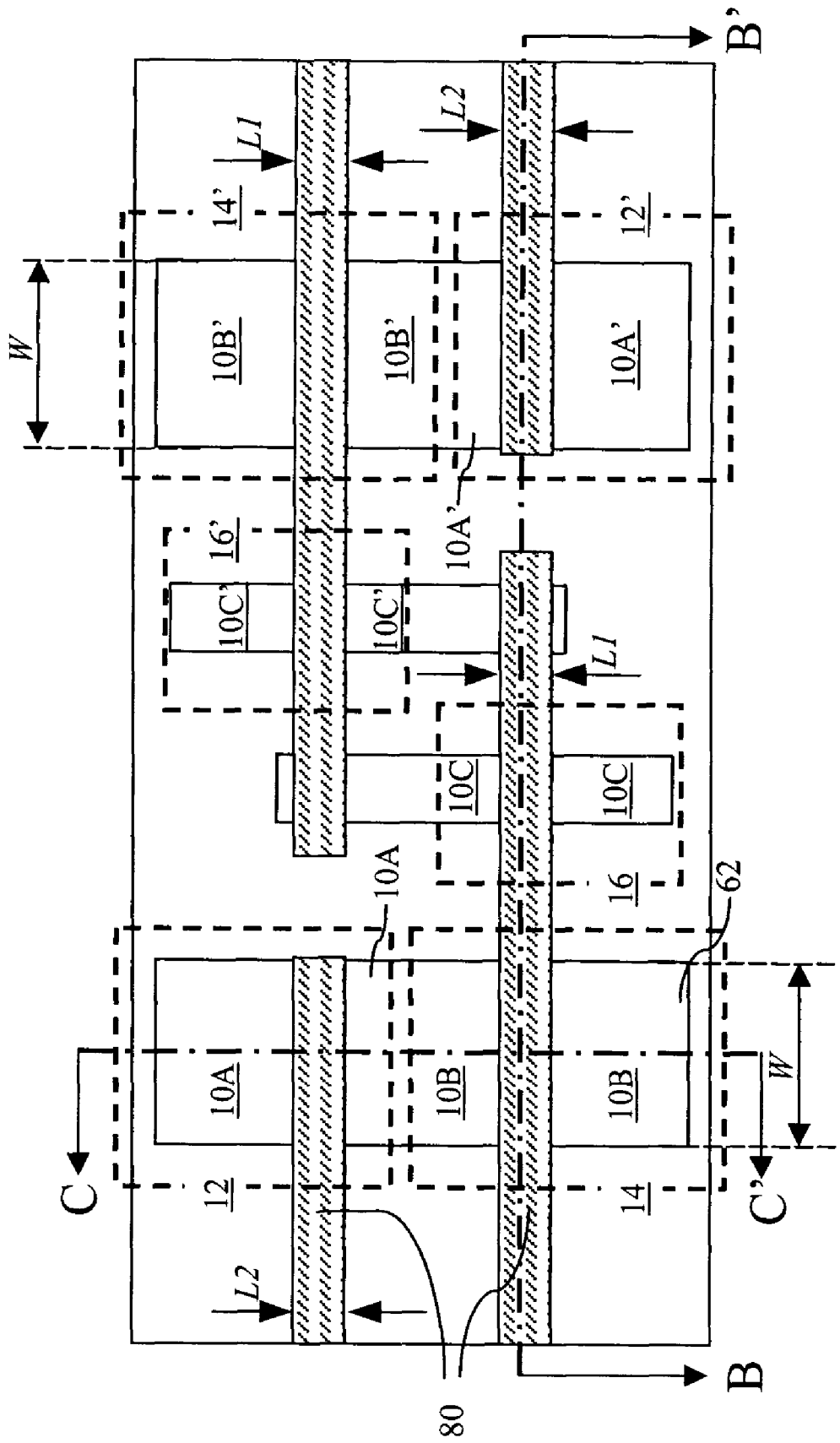
Figure 8B:
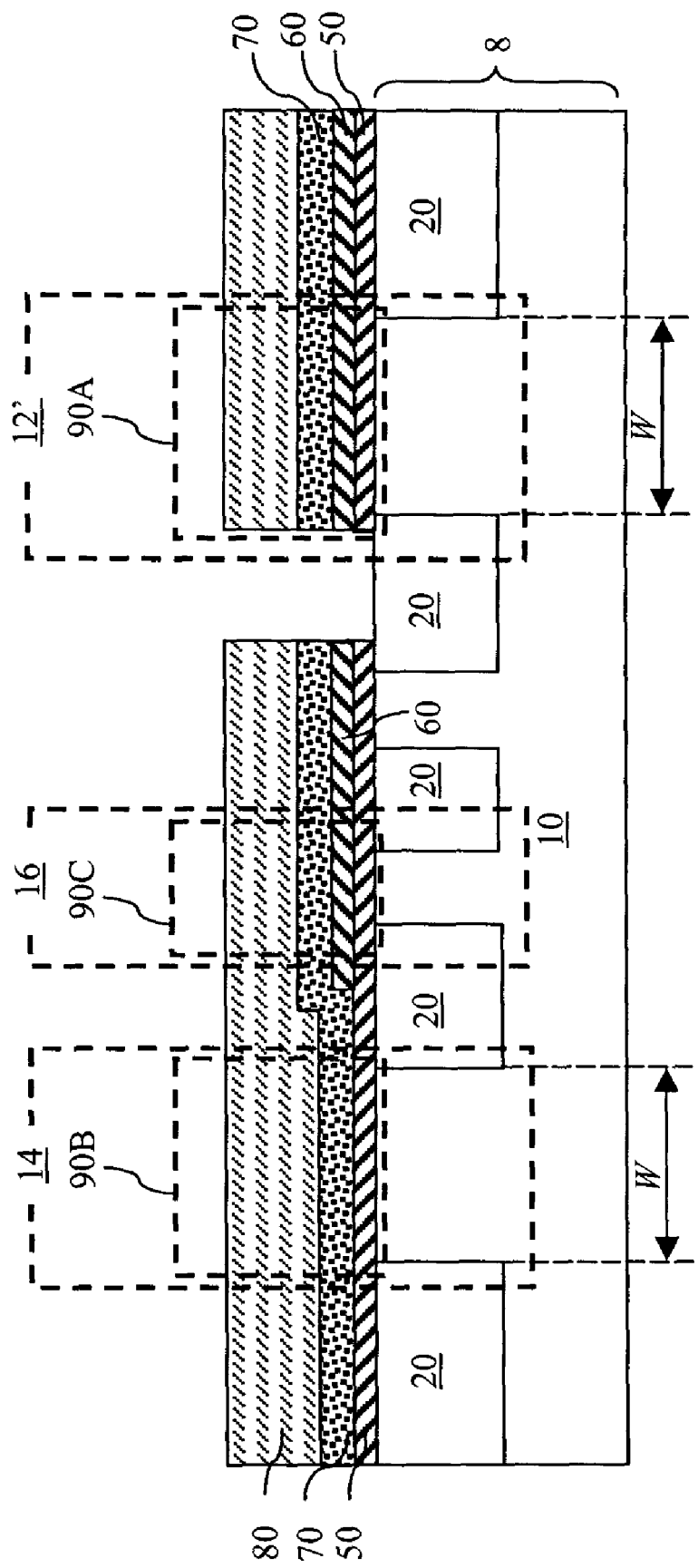

Referring to FIGS. 8A and 8B, the various layers above a top surface of the semiconductor substrate 8 are patterned by lithographic methods and at least one etch to form various gate stacks in each of the first and second pass gate NFET regions (12, 12'), the first and second pull-down NFET regions (14, 14'), and the first and second pull-up PFET regions (16, 16'). Specifically, a first gate stack 90A is formed in each of the first and second pass gate NFET regions (12, 12'); a second gate stack 90B is formed in each of the first and second pull-down NFET regions (14, 14'); and a third gate stack 90C is formed in each of the first and second pull-up PFET regions (16, 16').

Each of the first gate stacks 90A comprises:

a first high dielectric constant (high-k) material portion comprising a high-k material having a dielectric constant greater than 4.0, which is a portion of the high-k material layer 50 within one of the first and second pass gate NFET regions (12, 12');

a metal containing dielectric portion vertically abutting the first high-k material portion and comprising a different material than the high-k material, which is a portion of the metal containing dielectric layer 60;

a first conductive metal nitride portion vertically abutting the metal containing dielectric portion and comprising a conductive metal nitride, which is a portion of the conductive metal nitride layer 70; and a first polycrystalline semiconductor material portion vertically abutting the first conductive metal nitride portion and comprising a polycrystalline semiconductor material, which is a portion of the polycrystalline semiconductor material layer 80.

Each of the second gate stacks 90B comprises:

a second high-k material portion comprising the high-k material, which is a portion of the high-k material layer 50 within one of the first and second pull-down NFET regions (14, 14');

a second conductive metal nitride portion vertically abutting the second high-k material portion and comprising the conductive metal nitride, which is another portion of the conductive metal nitride layer 70; and a second polycrystalline semiconductor material portion vertically abutting the second conductive metal nitride portion and comprising the polycrystalline semiconductor material, which is another portion of the polycrystalline semiconductor material layer 80.

Each of the third gate stacks 90C comprises:

a third high-k material portion comprising the high-k material, which is a portion of the high-k material layer 50 within one of the first and second pull-up PFET regions (16, 16');

another metal containing dielectric portion vertically abutting the third high-k material portion and comprising a same material as the metal containing dielectric portion, which is another portion of the metal containing dielectric layer 60; and a third conductive metal nitride portion vertically abutting the another metal containing dielectric portion and comprising the conductive metal nitride, which is yet another portion of the conductive metal nitride layer 70; and a third polycrystalline semiconductor material portion vertically abutting the third conductive metal nitride portion and comprising the polycrystalline semiconductor material, which is yet another portion of the polycrystalline semiconductor material layer 80.

Figure 9A:
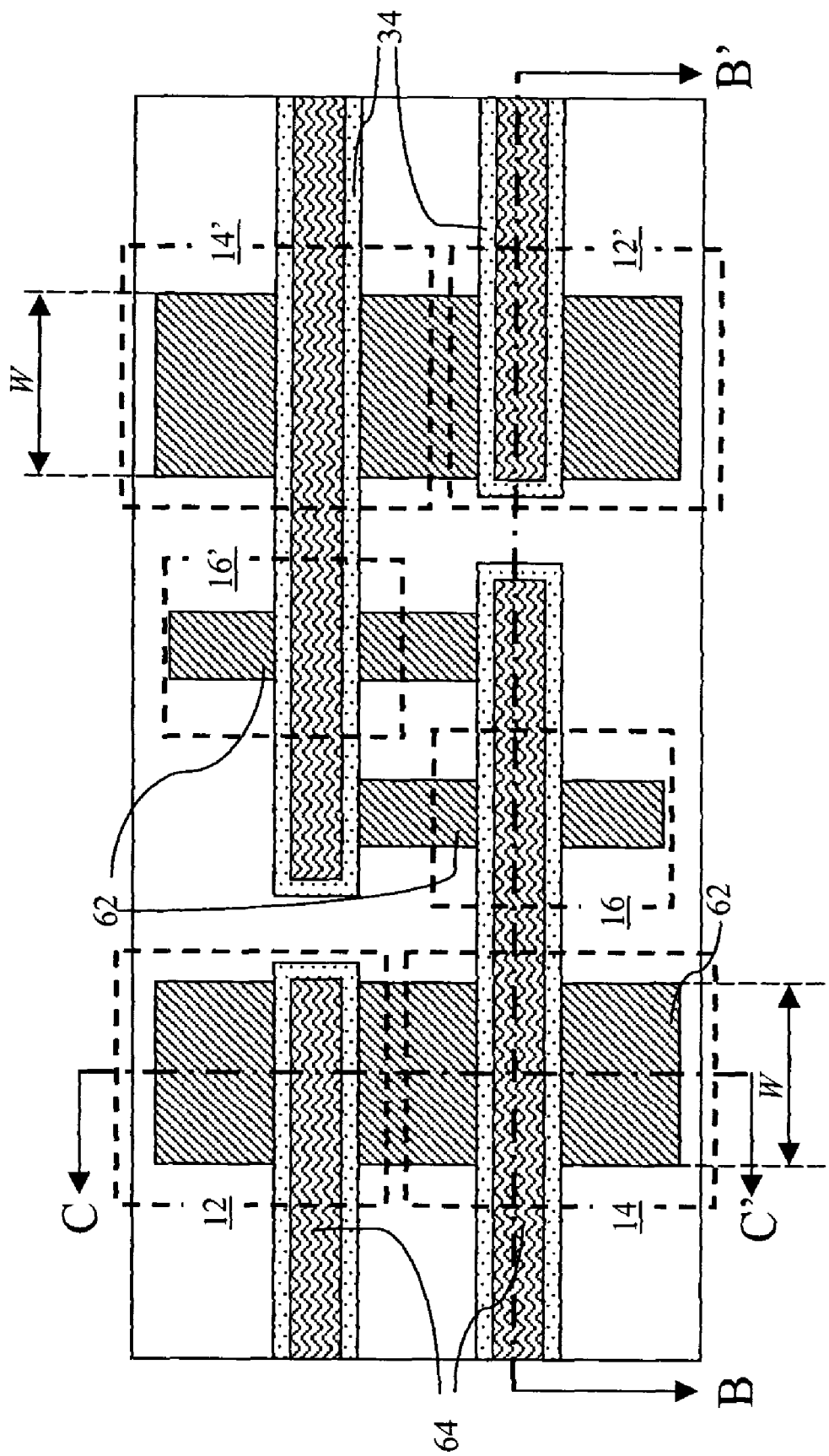
Figure 9B:
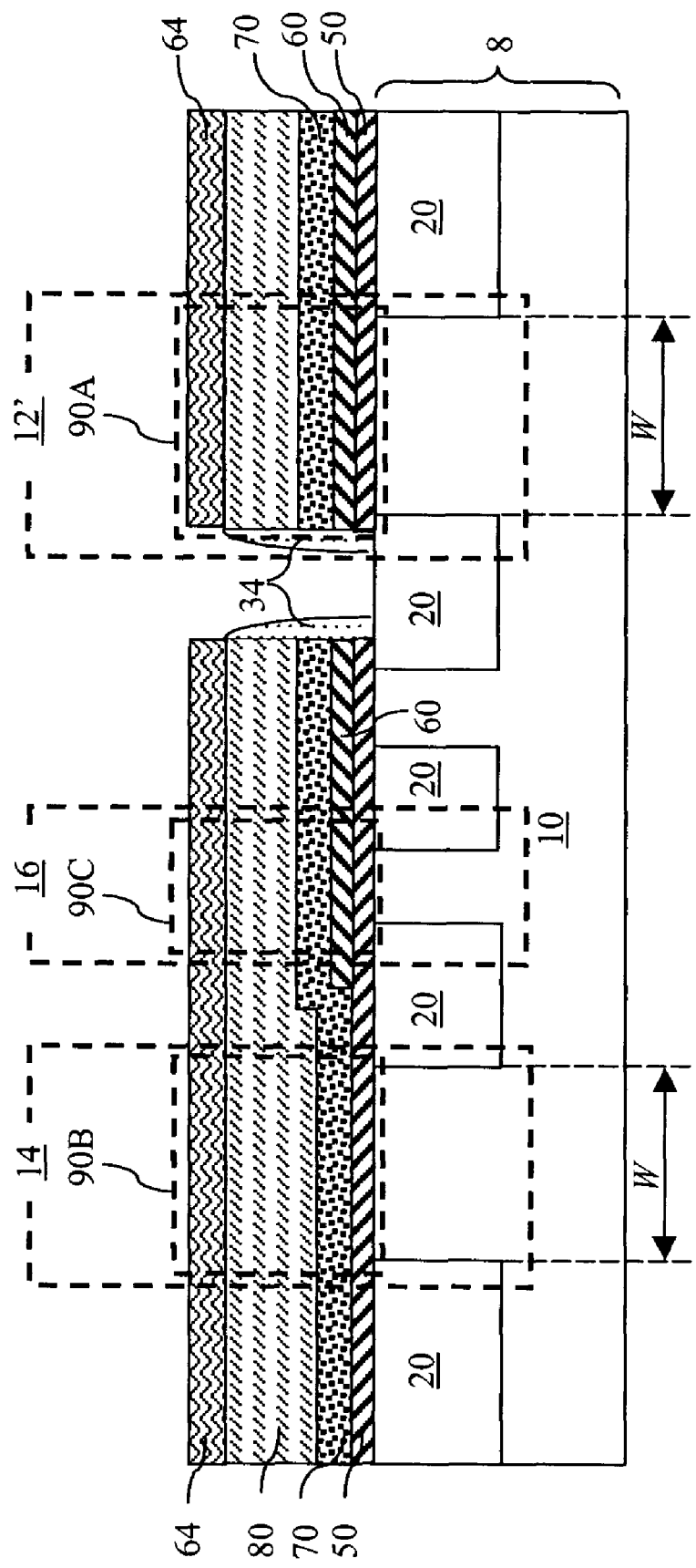

Referring to FIGS. 9A and 9B, gate spacers 34 are formed on sidewalls of the various gate stacks (90A, 90B, 90C) by methods well known in the art. Source and drain regions (not shown) are formed by ion implantation and an appropriate anneal in each of the first and second pass gate NFET regions (12, 12'), the first and second pull-down NFET regions (14, 14'), and the first and second pull-up PFET regions (16, 16'). Specifically, n-type dopants are implanted into the first and second pass gate NFET regions (12, 12') and the first and second pull-down NFET regions (14, 14'), and p-type dopants are implanted into the first and second pull-up PFET regions (16, 16').

Active area metal semiconductor alloy regions 62 and gate top metal semiconductor alloy regions 64 are formed by deposition of a metal layer on exposed semiconductor surfaces followed by an anneal that react the deposited metal layer with underlying semiconductor materials. The active area metal semiconductor alloy regions 62 are formed on exposed semiconductor surfaces of the semiconductor region 10. The gate top metal semiconductor alloy regions 64 are formed on top of the polycrystalline semiconductor material layer 80.

Figure 10A:
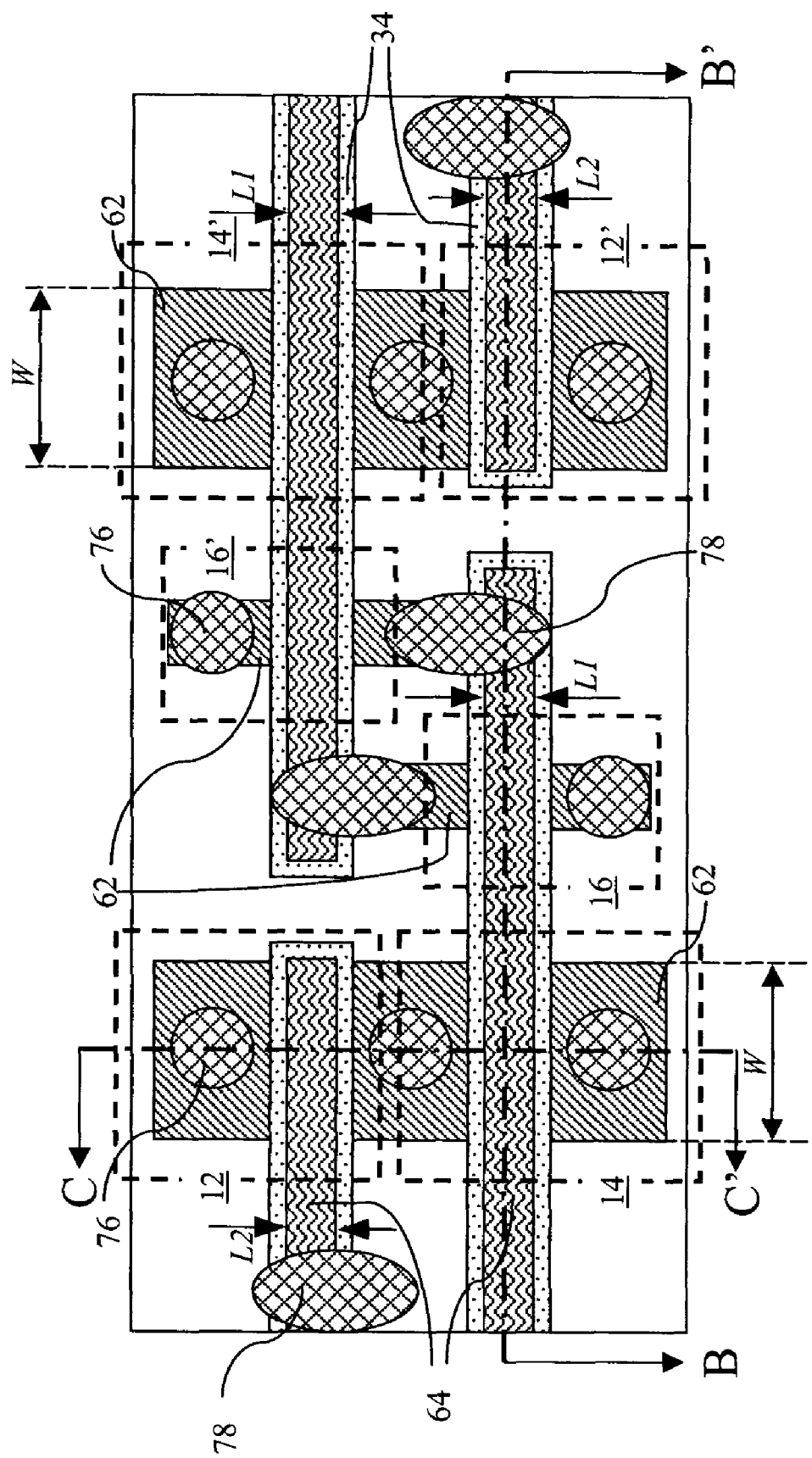
Figure 10B:
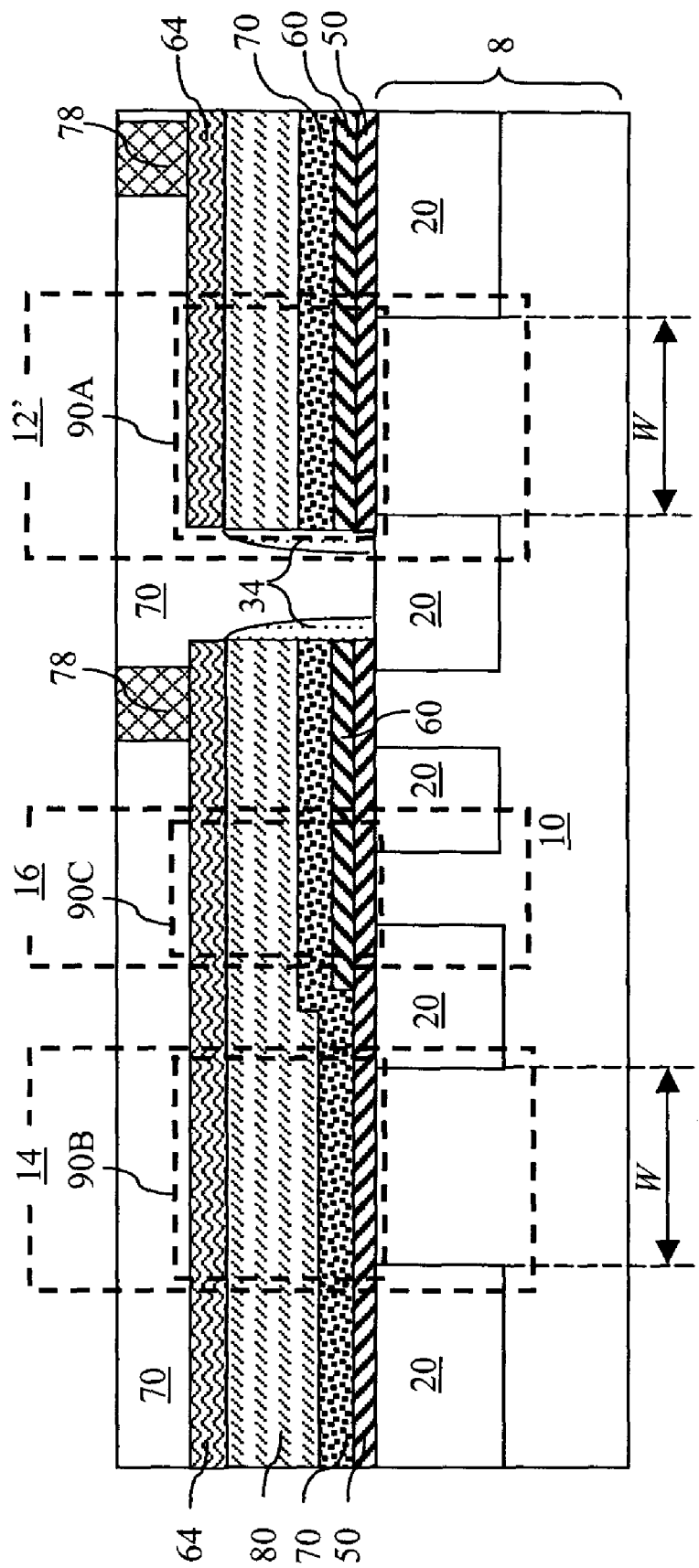
Figure 10C:
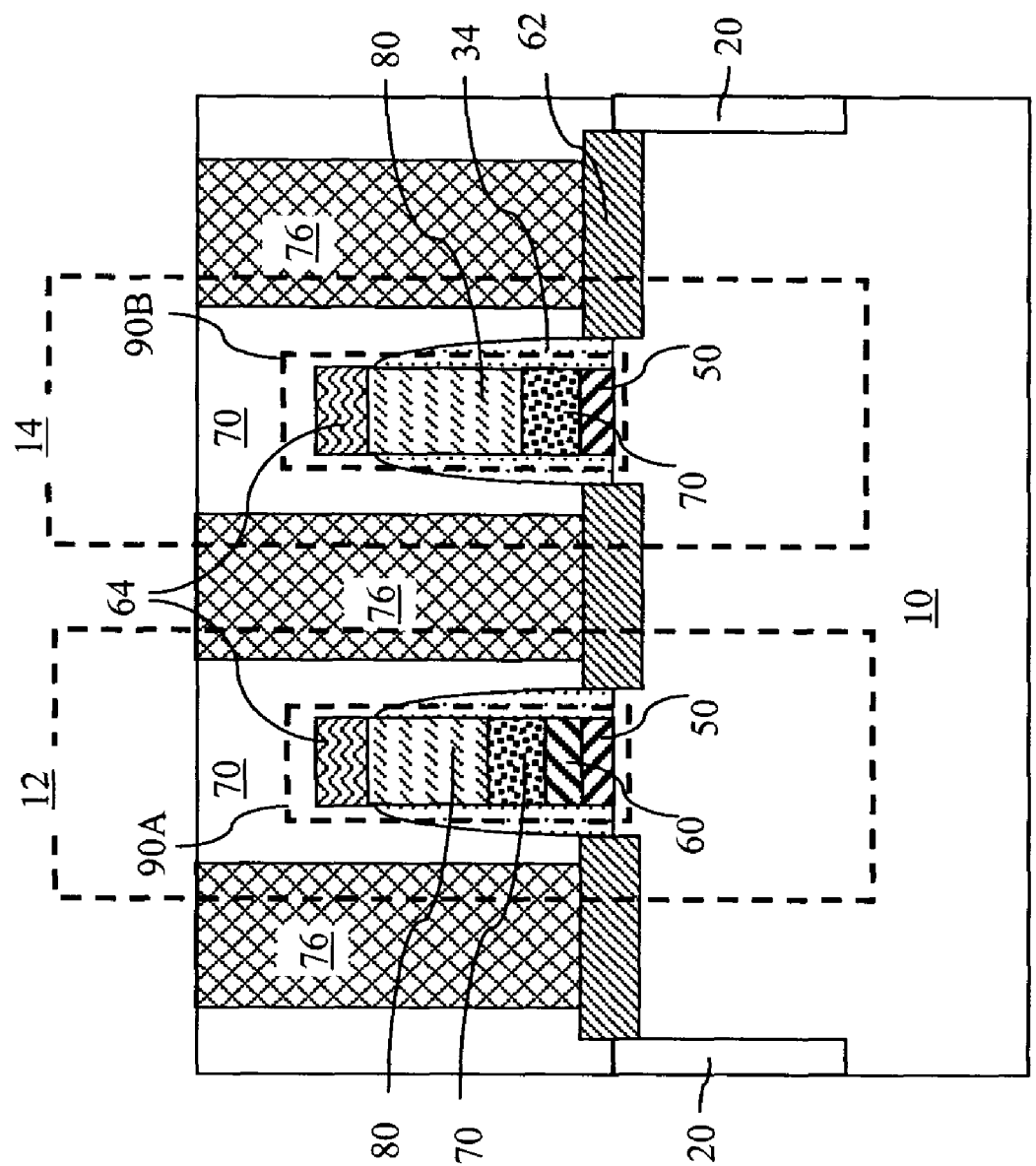

Referring to FIGS. 10A-10C, a mobile ion diffusion barrier layer (not shown) may be deposited over the first exemplary structure. The mobile ion diffusion barrier layer may comprise silicon nitride. The thickness of the mobile ion diffusion barrier layer may be from about 10 nm to about 80 nm. A middle-of-line (MOL) dielectric layer 70 is deposited over the mobile ion diffusion barrier layer, if present, or over the active area metal semiconductor alloy regions 62 and the gate top metal semiconductor alloy regions 64. The MOL dielectric layer 70 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Alternately, the MOL dielectric layer 70 may comprise a low-k dielectric material such as an organosilicate glass material, a spin-on low-k material, or a CVD dielectric material containing silicon, carbon, oxygen, and hydrogen. The thickness of the MOL dielectric layer 70 may be from about 200 nm to about 500 nm. The MOL dielectric layer 70 may be self-planarizing, or may be planarized, for example, by chemical mechanical polishing (CMP).

Various contact via holes are formed in the MOL dielectric layer 70 and filled with metal to from metal contact vias 76 and metal contact bars 78. Specifically, metal contact vias 76 are formed on various portions of the active area metal semiconductor alloy regions 62. Metal contact bars 78 are formed to simultaneously contact a portion of the gate top metal semiconductor alloy regions 64 and a portion of the active area metal semiconductor alloy regions 62 simultaneously. A first level metal wiring (not shown), which is typically referred to as a "M1" level wiring, is thereafter formed followed by further formation of other back-end-of-line (BEOL) structures.

The first exemplary semiconductor structure is a static random access memory. The rectangular surface area of the primary and secondary first active semiconductor areas (9A, 9B) enable printing of a lithographic image of high fidelity with minimal adverse impacts of optical proximity effects during a lithographic step.

Figure 11A:
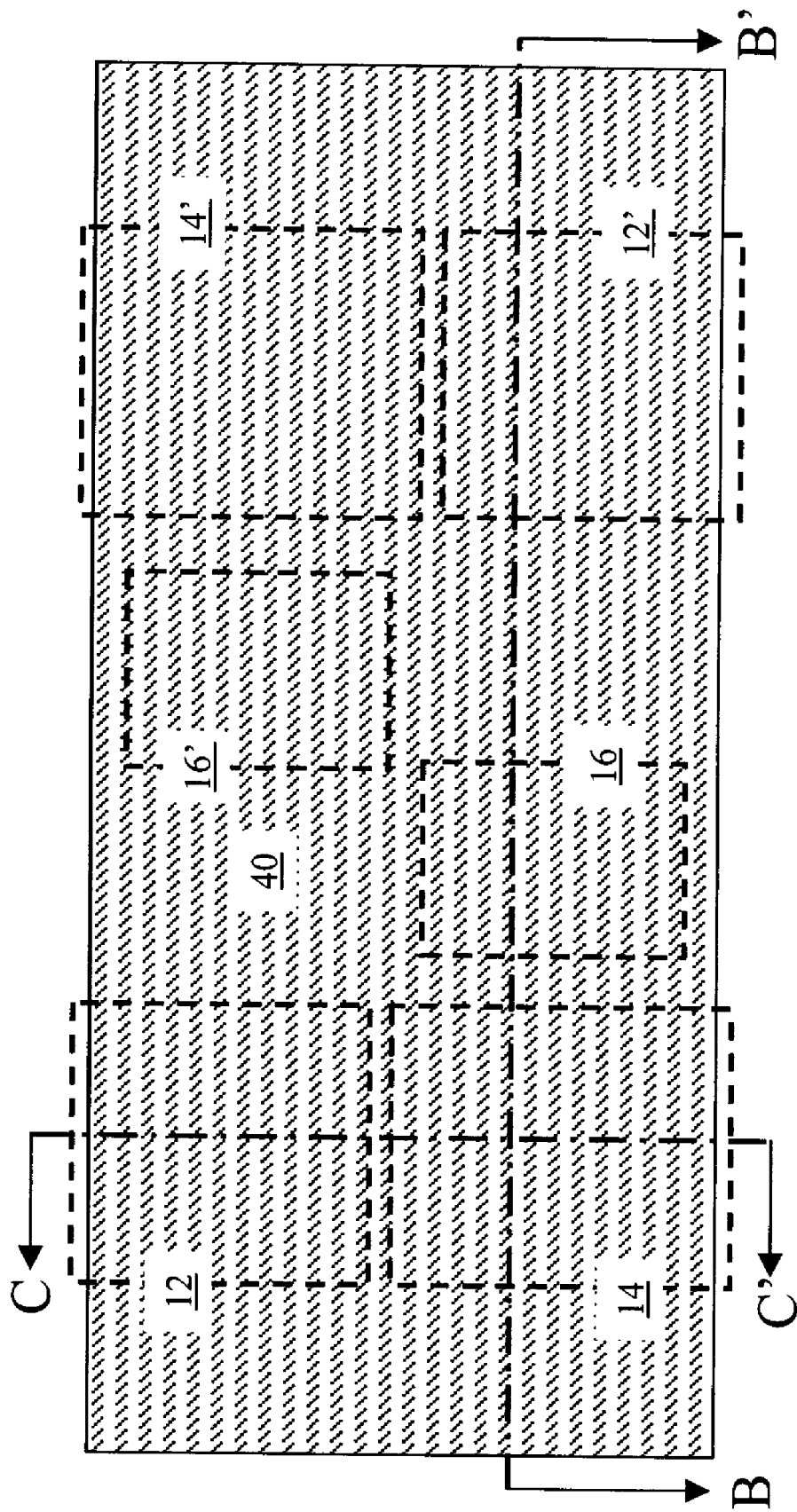
FIGS. 11A-17C are sequential views of a second exemplary semiconductor structure according to a second embodiment of the present invention. Figures with the same numeric label correspond to the same stage of a manufacturing process. Figures with the suffix "A" are top-down views. Figures with the suffix "B" are vertical cross-sectional views along the plane B-B' of the corresponding figure with the same numeric label and the suffix "A.
Figure 11B:
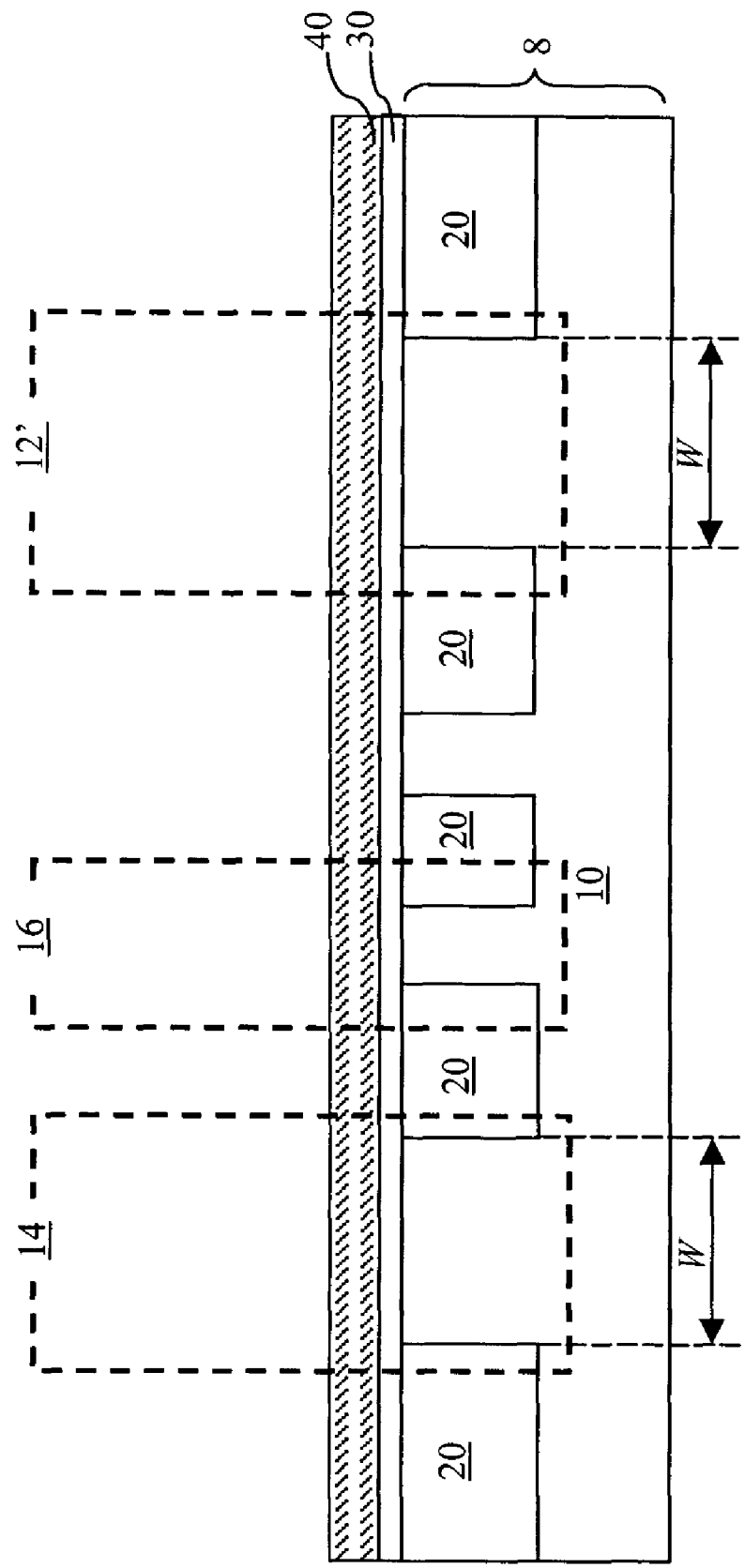

Referring to FIGS. 11A and 11B, a second exemplary semiconductor structure according to a second embodiment of the present invention is derived from the first exemplary semiconductor structure in FIGS. 4A and 4B by forming a semiconductor oxide based gate dielectric layer 30 on exposed top surfaces of the semiconductor region 10. The semiconductor oxide based gate dielectric layer 30 comprises a semiconductor oxide or a semiconductor oxynitride. In case the semiconductor layer 10 comprises silicon, the semiconductor oxide based dielectric layer 30 may comprise silicon oxide or silicon oxynitride. The semiconductor oxide based dielectric layer 30 may be formed by thermal oxidation and optional thermal nitridation. Alternatively or additionally, chemical vapor deposition may be employed to form the semiconductor oxide based dielectric layer 30. Methods of forming the semiconductor oxide based dielectric layer 30 are known in the art. The thickness of the semiconductor oxide based gate dielectric layer 30 is from about 1.0 nm to about 3 nm, although lesser and greater thickness are herein explicitly contemplated also.

A doped polycrystalline semiconductor material layer 40 is formed directly on the semiconductor oxide based gate dielectric layer 30. The doped polycrystalline semiconductor material layer 40 comprises a doped polycrystalline semiconductor material including at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. It is understood that an amorphous semiconductor material layer may be deposited and subsequently converted to the doped polycrystalline semiconductor material layer 40 in a thermal anneal. The doped polycrystalline semiconductor material layer 40 may be deposited with in-situ doping as a doped polycrystalline semiconductor material layer, or may be deposited as an undoped semiconductor material layer and subsequently doped by ion implantation. The thickness of the doped polycrystalline semiconductor material layer 40 may be from about 10 nm to about 30 nm, although lesser and greater thicknesses are also explicitly contemplated herein.

Preferably, the material and the doping of the doped polycrystalline semiconductor material layer 40 is optimized such that the work function of the first polycrystalline semiconductor material layer 40, which is herein referred to as a third work function $\Phi 3$, is close to the valence band edge of the semiconductor material in semiconductor region 10 than to the conduction band edge.

Figure 12A:
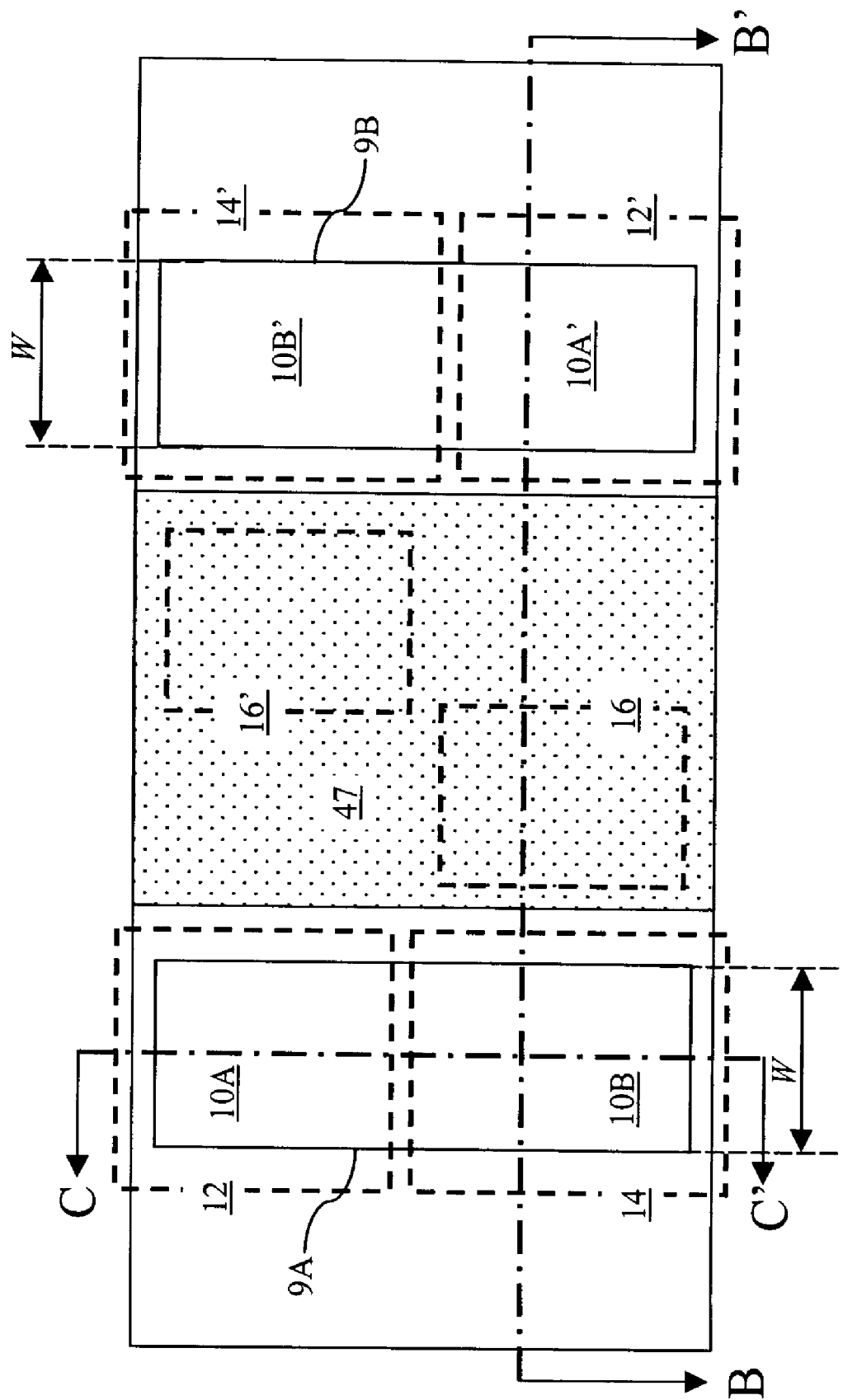
Figure 12B:
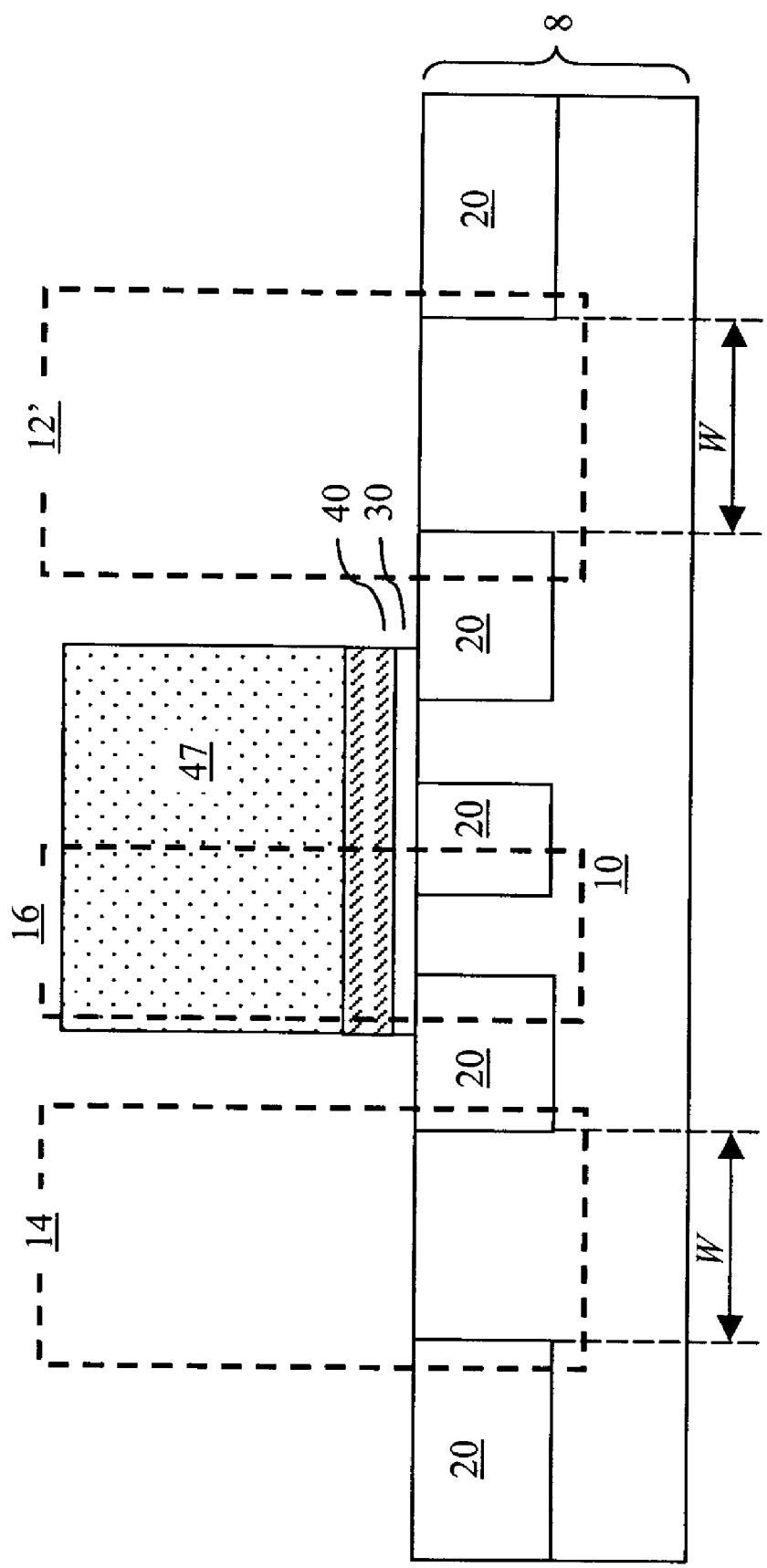

Referring to FIGS. 12A and 12B, a first photoresist 47 is applied over the doped polycrystalline semiconductor material layer 40 and lithographically patterned to form a stack of the doped polycrystalline semiconductor material layer 40 and the semiconductor oxide based gate dielectric 30 in the first and second pull-up PFET regions (16, 16'). The doped polycrystalline semiconductor material layer 40 and the semiconductor oxide based gate dielectric layer 30 are removed in the first and second pass gate NFET regions (12, 12') and the first and second pull-down NFET regions (14, 14'). The first photoresist 47 is subsequently removed, for example, by ashing. A suitable surface clean such as a wet clean may be performed at this point.

Figure 13A:
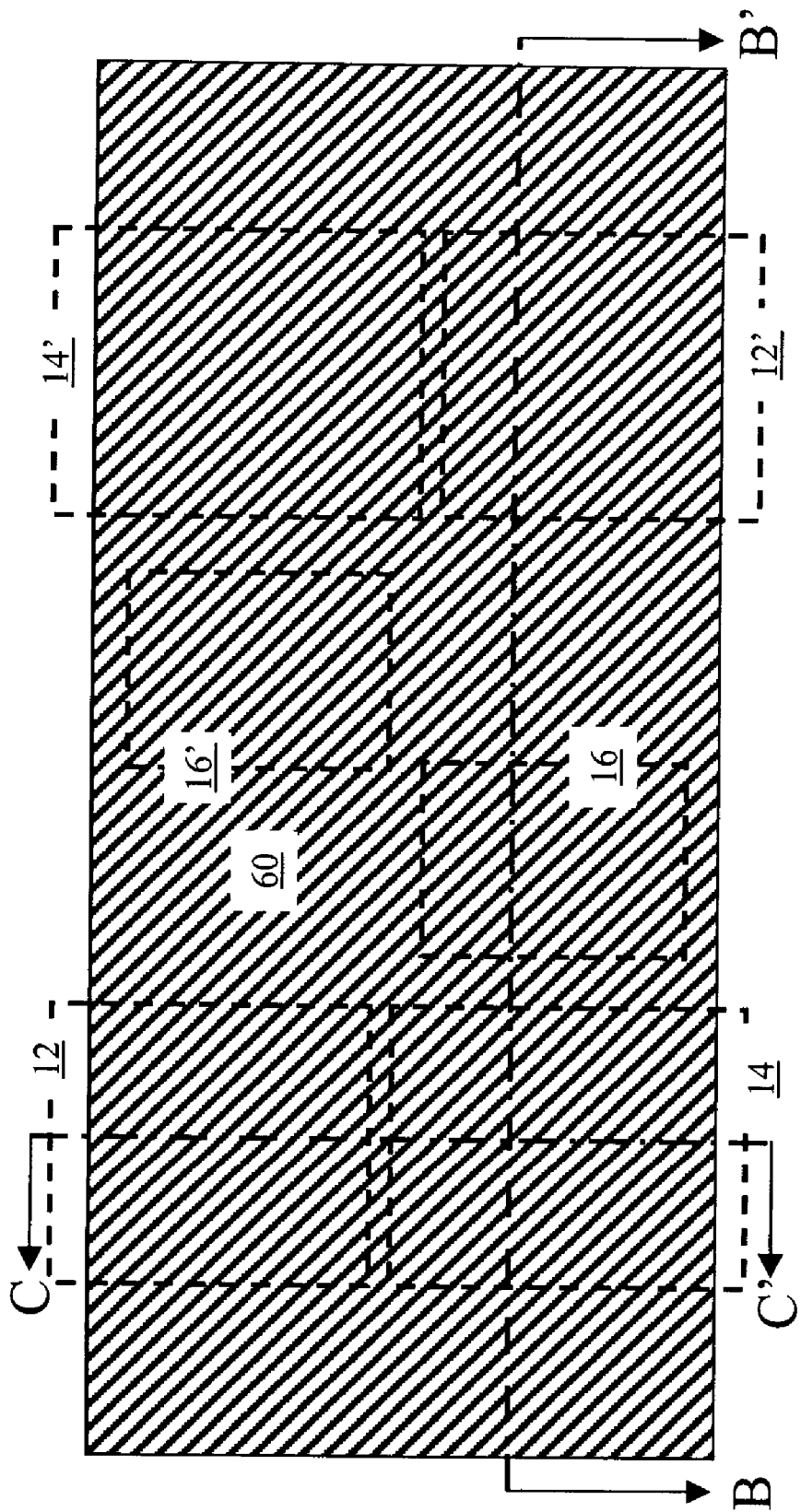
Figure 13B:
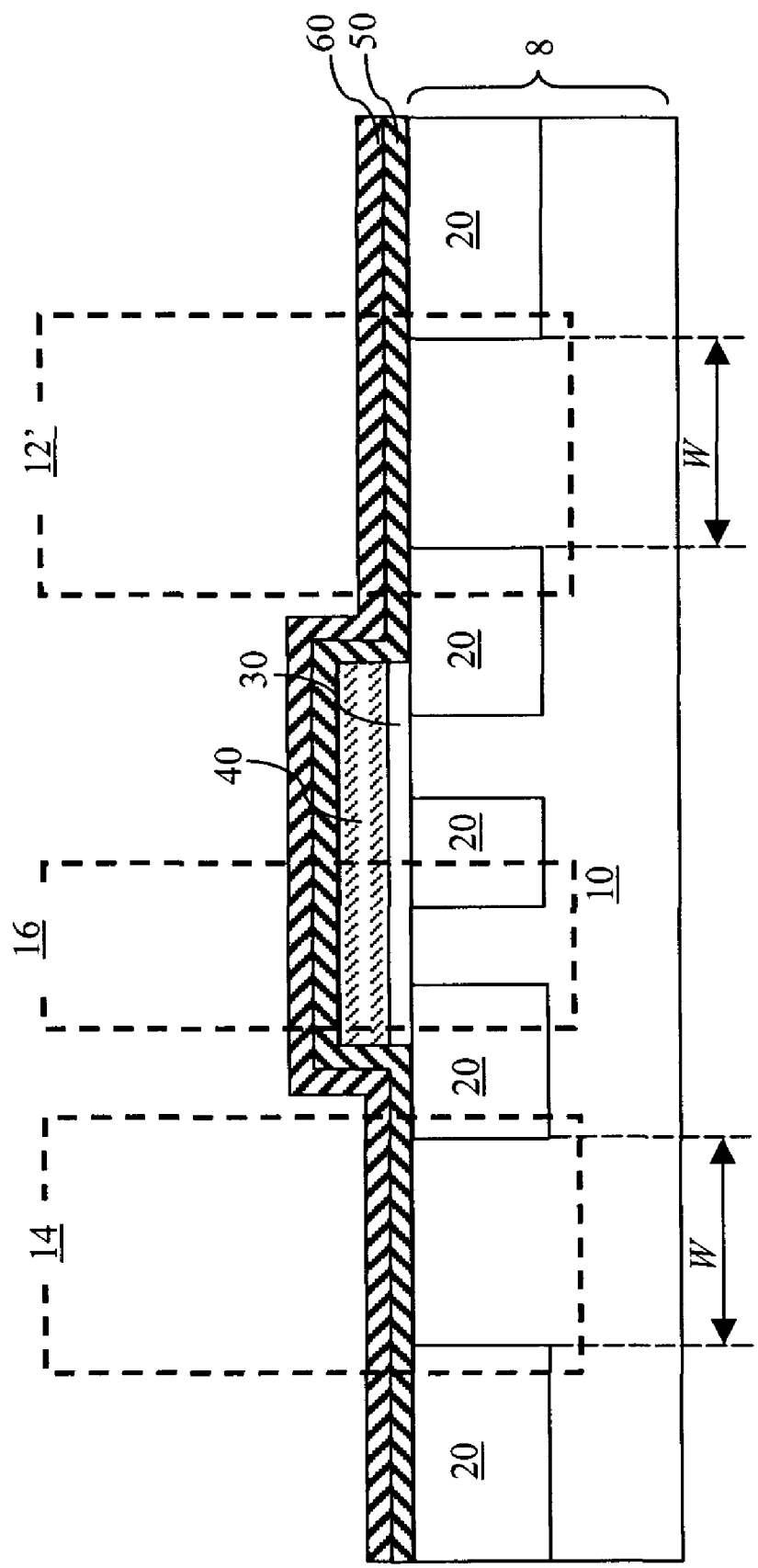

Referring to FIGS. 13A and 13B, a high dielectric constant (high-k) material layer 50 is formed on the exposed surfaces of the semiconductor substrate 8 in the first and second pass gate NFET regions (12, 12') and the first and second pull-down NFET regions (14, 14') and on the stack of the doped polycrystalline semiconductor material layer 40 and the semiconductor oxide based gate dielectric 30 in the first and second pull-up PFET regions (16, 16'). The high-k material layer 50 has the same composition and thickness, and is formed by the same method, as in the first embodiment.

Optionally, a chemical oxide layer (not shown) may be formed directly on exposed surfaces of the semiconductor region 10 prior to formation of the high-k material layer 50 as in the first embodiment.

A metal containing dielectric layer 60 is formed directly on the high-k material layer 50. The metal containing dielectric layer 60 has the same composition and thickness, and is formed by the same method, as in the first embodiment.

Figure 14A:
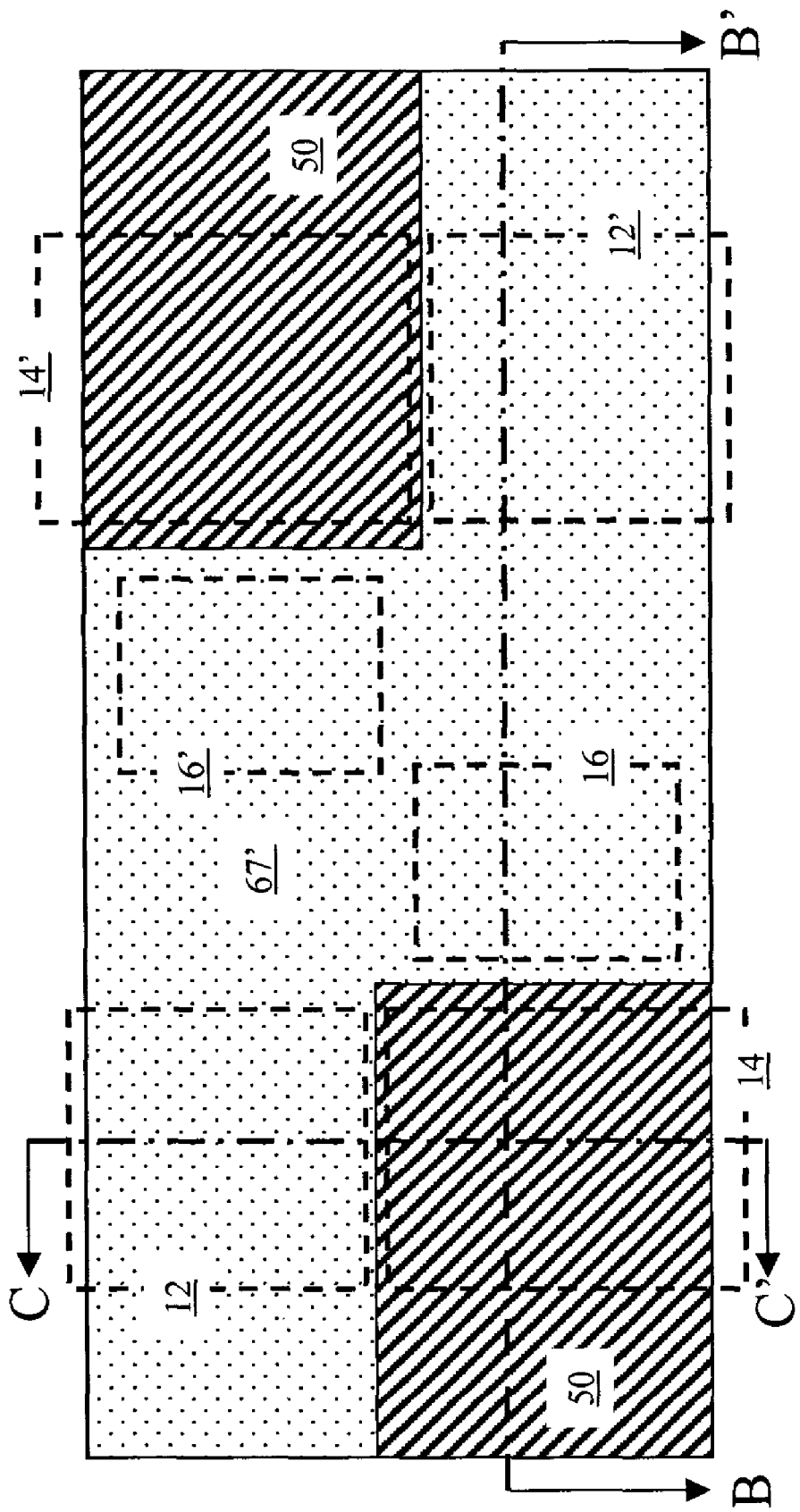
Figure 14B:
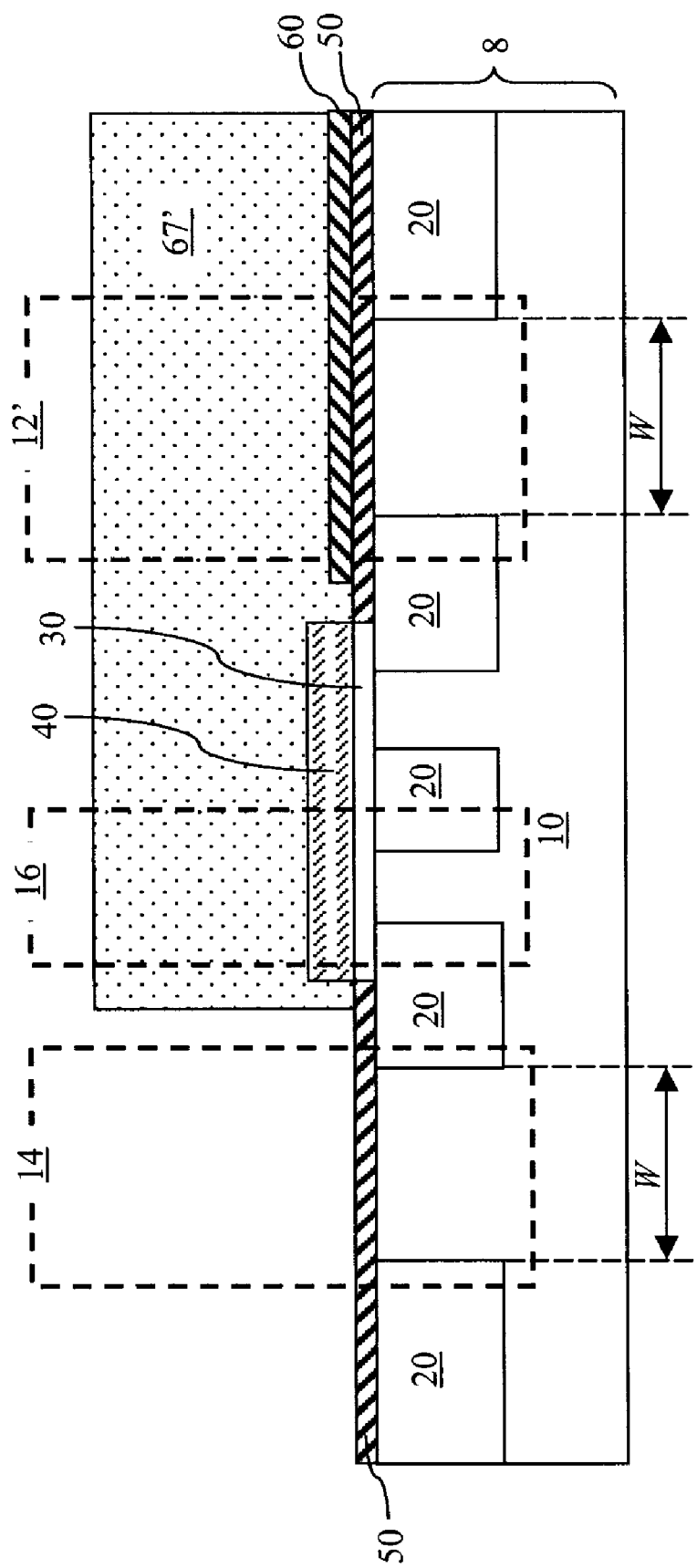

Referring to FIGS. 14A and 14B, a second photoresist 67' is applied over the metal containing dielectric layer 60 and lithographically patterned to cover the metal containing dielectric layer 60 in the first and second pass gate NFET regions (12, 12') and to cover the stack of the doped polycrystalline semiconductor material layer 40 and the semiconductor oxide based gate dielectric 30 in the first and second pull-up PFET regions (16, 16'). The exposed portions of the metal containing dielectric layer 60 in the first and second pull-down NFET regions (14, 14') are removed by an etch, which may be an isotropic etch such as a wet etch or an anisotropic etch such as a reactive ion etch. Preferably, the etch is selective to the high-k material layer 50. The metal containing dielectric layer 60 is preserved in the first and second pass gate NFET regions (12, 12'). Further, the stack of the doped polycrystalline semiconductor material layer 40 and the semiconductor oxide based gate dielectric 30 is preserved in the first and second pull-up PFET regions (16, 16'). The second photoresist 67' is subsequently removed, for example, by ashing. A suitable surface clean such as a wet clean may be performed at this point.

Figure 15A:
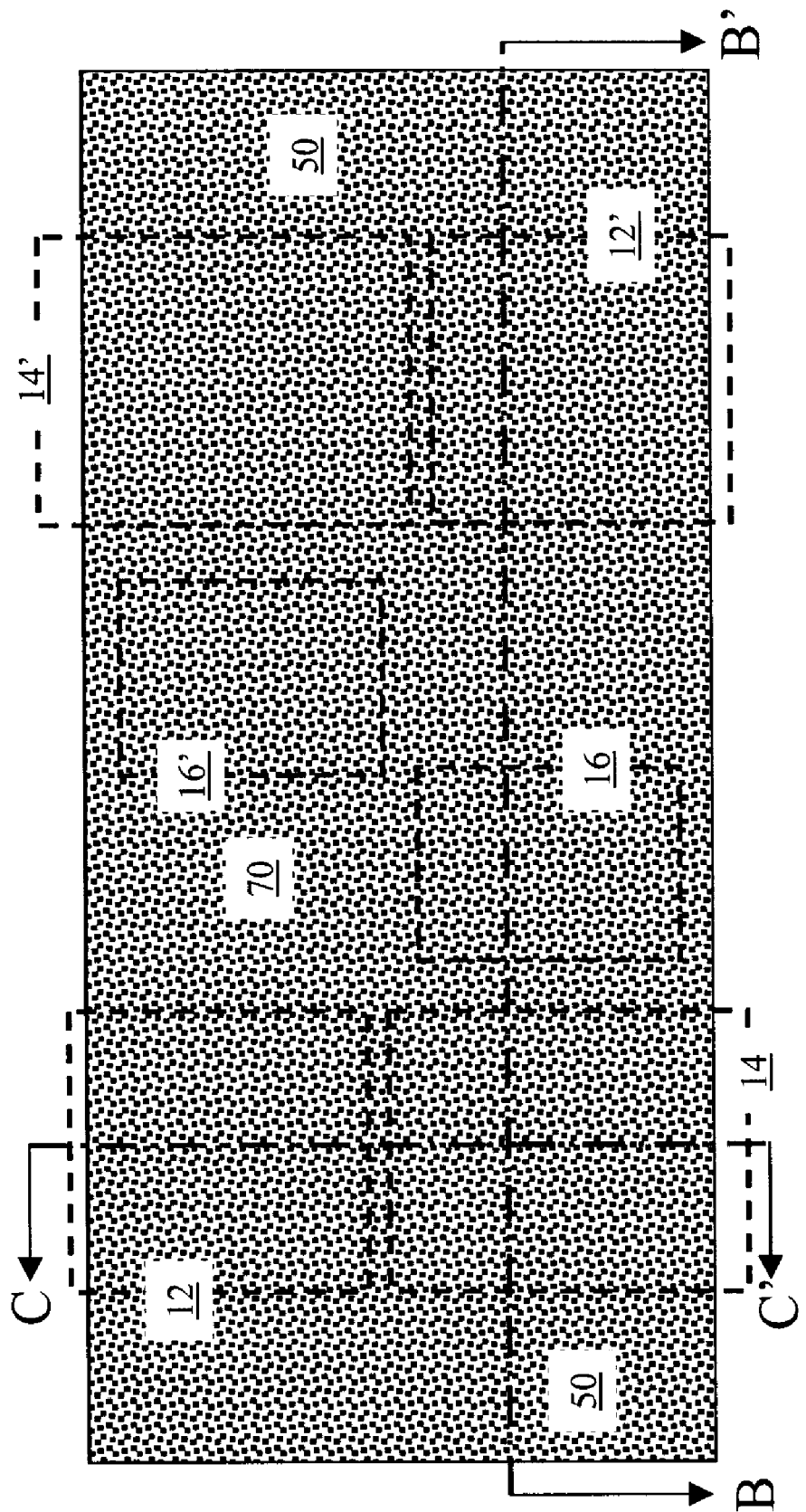
Figure 15B:
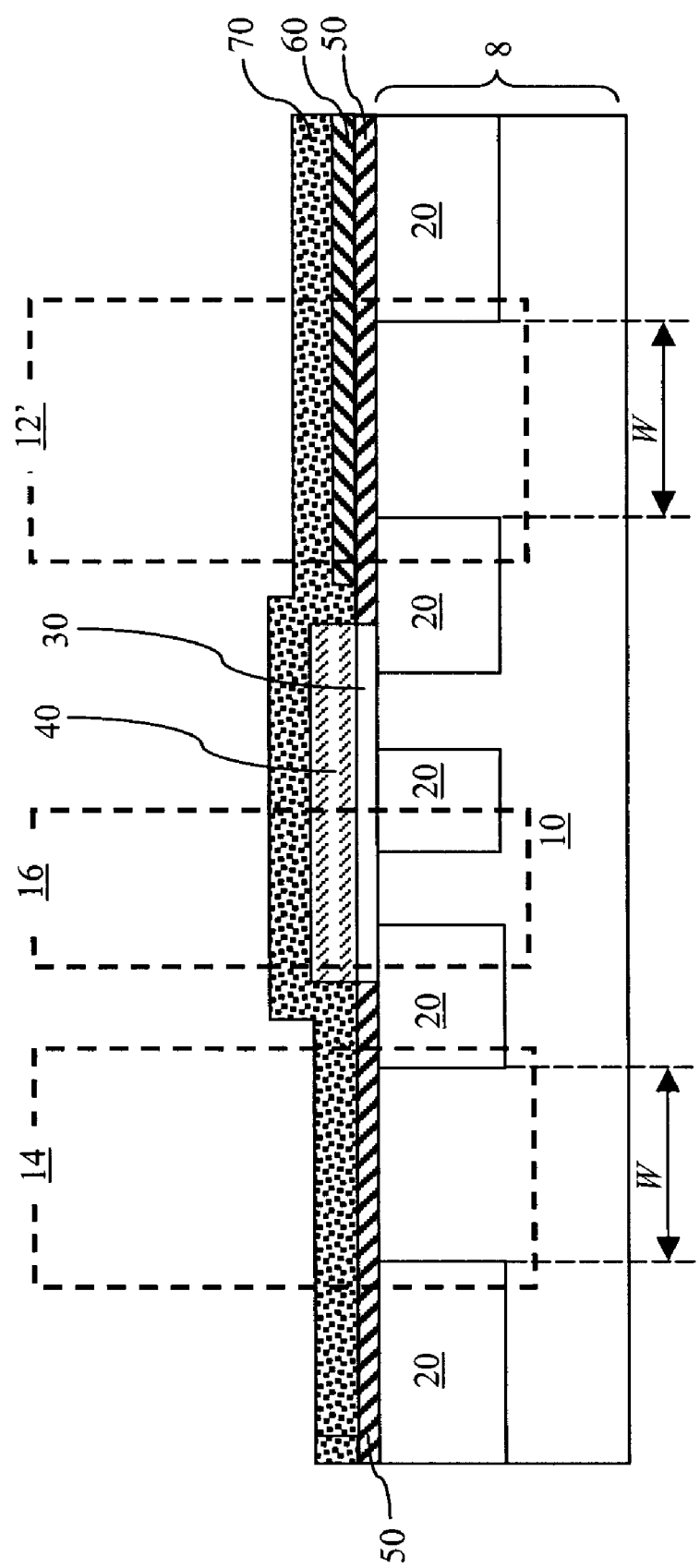

Referring to FIGS. 15A and 15B, a conductive metal nitride layer 70 is formed directly on the metal containing dielectric layer 60, exposed portions of the high-k material layer 50, and on the polycrystalline semiconductor material layer 40. The conductive metal nitride layer 70 has the same composition and thickness, and is formed by the same method, as in the first embodiment.

The high-k material layer 50, the metal containing dielectric layer 60, and the conductive metal nitride layer 70 may be optimized such that the work function of a first stack of the high-k material layer 50, the metal containing dielectric layer 60, and the conductive metal nitride layer 70, which is herein referred to as the first work function $\Phi 1$, is between the conduction band edge and the balance band edge of the semiconductor material in the semiconductor region 10. The composition and thickness of each layer may be optimized for this purpose.

Further, the high-k material layer 50 and the conductive metal nitride layer 70 may be optimized such that the work function of the stack of the high-k material layer 50 and the conductive metal nitride layer 70, which is herein referred to as the second work function $\Phi 2$, is greater than the first work function $\Phi 1$.

Yet further, the stack of the doped polycrystalline semiconductor material layer 40 and the semiconductor oxide based gate dielectric 30 may be optimized such that the work function of the stack of the stack of the doped polycrystalline semiconductor material layer 40 and the semiconductor oxide based gate dielectric 30, which is herein referred to as a third work function $\Phi 3$, is greater than the first work function $\Phi 1$.

Figure 16A:
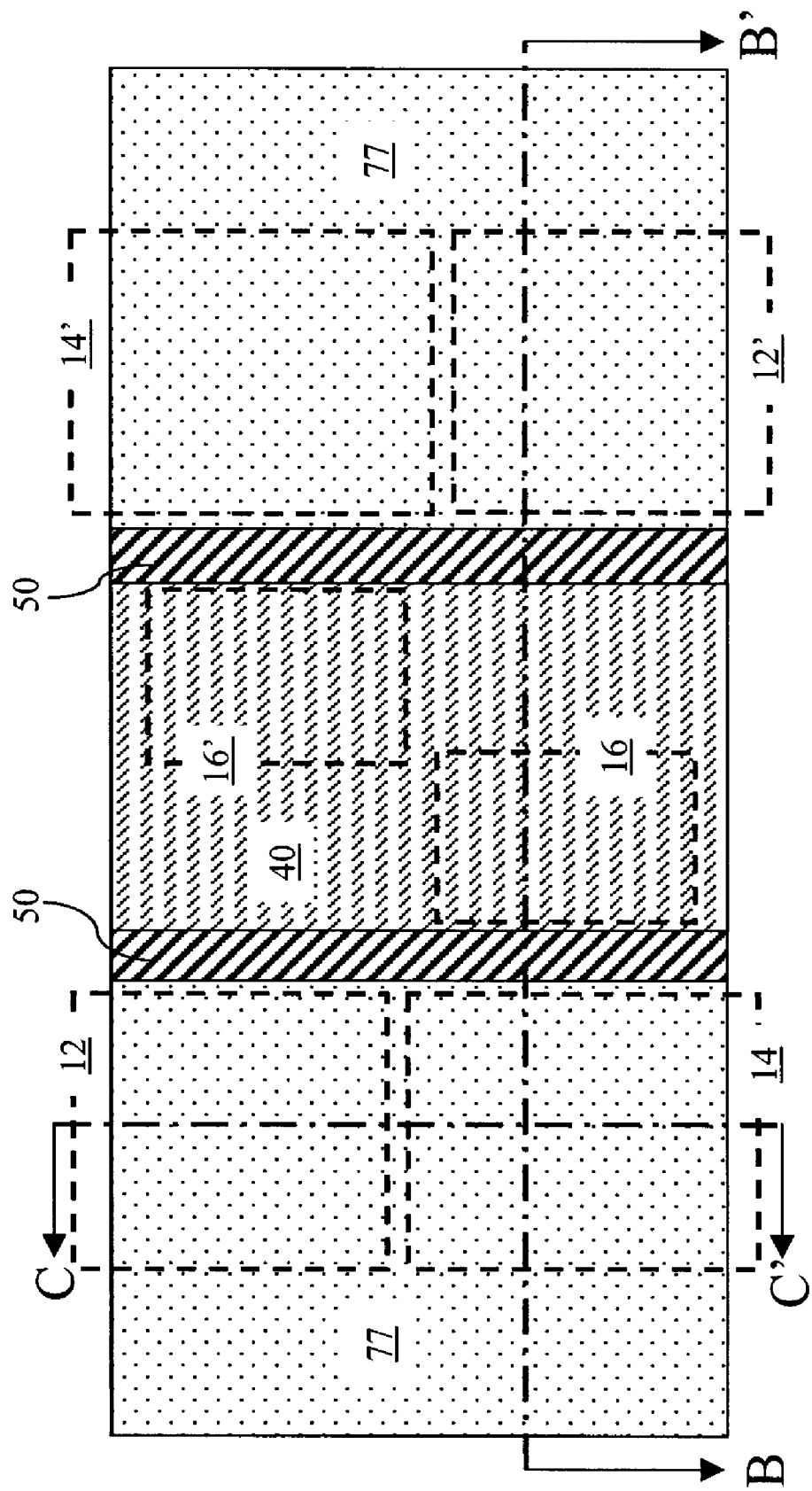
Figure 16B:
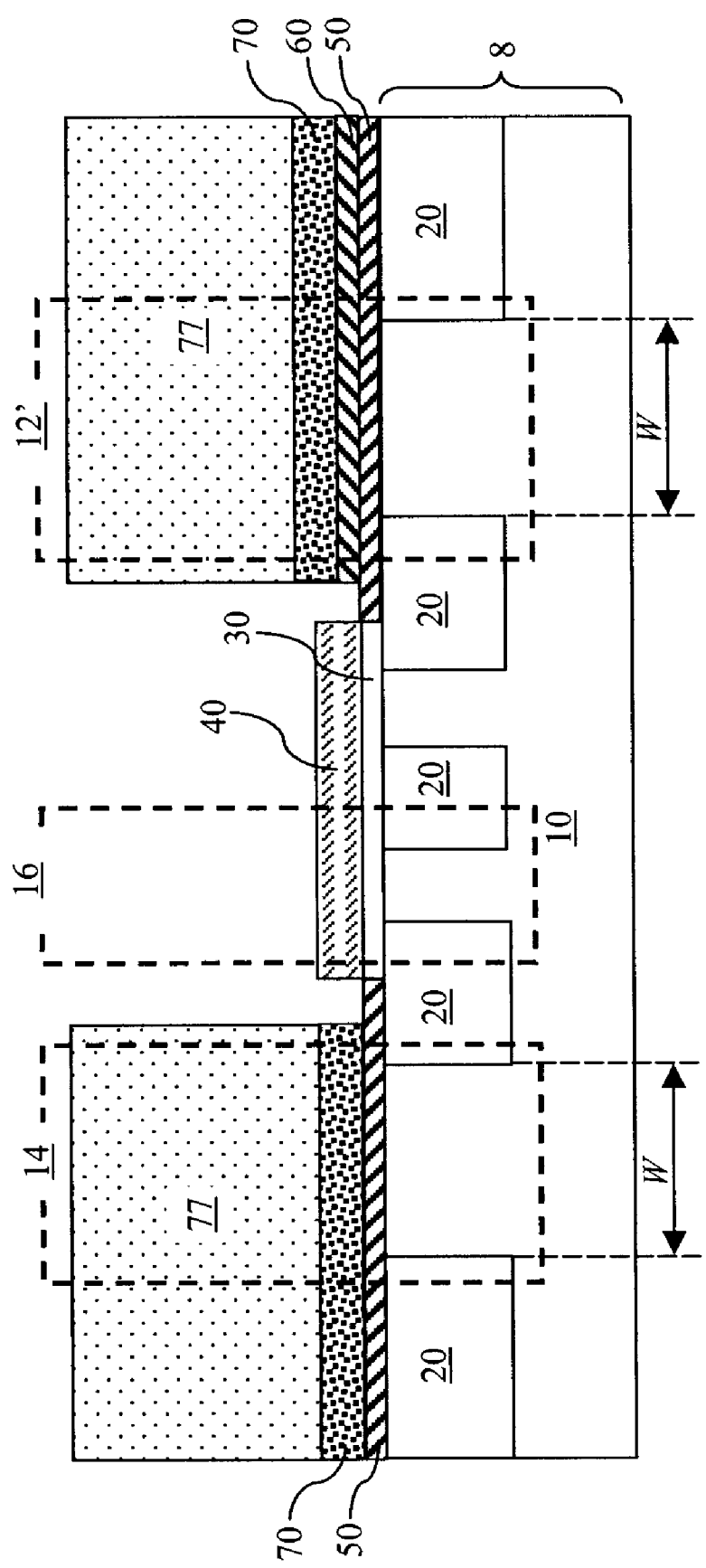

Referring to FIGS. 16A and 16B, a third photoresist 77 is applied over the conductive metal nitride layer 70 and lithographically patterned to cover the first and second pass gate NFET regions (12, 12') and the first and second pull-down NFET regions (14, 14'), while exposing the first and second pull-up PFET regions (16, 16'). Exposed portions of the metal nitride layer 70 are removed by an etch, which may be a reactive ion etch. Further, the portion of the metal containing dielectric layer 60 and the high-k material layer 50 are removed from above the stack of the doped polycrystalline semiconductor material layer 40 and the semiconductor oxide based gate dielectric layer 30 in the first and second pull-up PFET regions (16, 16'). The high-k material layer 50 may, or may not, be completely removed from outside the region covered by the third photoresist 77. The third photoresist 77 is subsequently removed, and a suitable surface clean such as a wet clean may be performed at this point.

Subsequently, a polycrystalline semiconductor material layer 80 is formed on a top surface of the conductive metal nitride layer 70. The polycrystalline semiconductor material layer 80 has the same composition and thickness, and is formed by the same method, as in the first embodiment.

Processing steps corresponding to FIGS. 8A and 8B of the first embodiment are performed. The various layers above a top surface of the semiconductor substrate 8 are patterned by lithographic methods and at least one etch to form various gate stacks in each of the first and second pass gate NFET regions (12, 12'), the first and second pull-down NFET regions (14, 14'), and the first and second pull-up PFET regions (16, 16'). Gate spacers 34 and source and drain regions (not shown) are formed as in the first embodiment. Active area metal semiconductor alloy regions 62 and gate top metal semiconductor alloy regions 64 are also formed as in the first embodiment.

A mobile ion diffusion barrier layer (not shown) may be deposited over the second exemplary structure. A middle-of-line (MOL) dielectric layer 70 is deposited over the mobile ion diffusion barrier layer, if present, or over the active area metal semiconductor alloy regions 62 and the gate top metal semiconductor alloy regions 64 as in the first embodiment. The MOL dielectric layer 70 has the same composition and thickness, and is formed by the same method, as in the first embodiment. Various contact via holes are formed in the MOL dielectric layer 70 and filled with metal to from metal contact vias 76 and metal contact bars 78. A first level metal wiring (not shown), which is typically referred to as a "M1" level wiring, is thereafter formed followed by further formation of other back-end-of-line (BEOL) structures.

The second exemplary semiconductor structure comprises a first gate stack 90A is formed in each of the first and second pass gate NFET regions (12, 12'); a second gate stack 90B is formed in each of the first and second pull-down NFET regions (14, 14'); and a third gate stack 90C' is formed in each of the first and second pull-up PFET regions (16, 16').

Each of the first gate stacks 90A comprises:

a first high dielectric constant (high-k) material portion comprising a high-k material having a dielectric constant greater than 4.0, which is a portion of the high-k material layer 50 within one of the first and second pass gate NFET regions (12, 12');

a metal containing dielectric portion vertically abutting the first high-k material portion and comprising a different material than the high-k material, which is a portion of the metal containing dielectric layer 60;

a first conductive metal nitride portion vertically abutting the metal containing dielectric portion and comprising a conductive metal nitride, which is a portion of the conductive metal nitride layer 70; and a first polycrystalline semiconductor material portion vertically abutting the first conductive metal nitride portion and comprising a polycrystalline semiconductor material, which is a portion of the polycrystalline semiconductor material layer 80.

Each of the second gate stacks 90B comprises:

a second high-k material portion comprising the high-k material, which is a portion of the high-k material layer 50 within one of the first and second pull-down NFET regions (14, 14');

a second conductive metal nitride portion vertically abutting the second high-k material portion and comprising the conductive metal nitride, which is another portion of the conductive metal nitride layer 70; and a second polycrystalline semiconductor material portion vertically abutting the second conductive metal nitride portion and comprising the polycrystalline semiconductor material, which is another portion of the polycrystalline semiconductor material layer 80.

Each of the third gate stacks 90C' comprises:

a semiconductor oxide based gate dielectric portion comprising a semiconductor oxide or a semiconductor oxynitride, which is a portion of the semiconductor oxide based gate dielectric layer 30;

a doped polycrystalline semiconductor material portion vertically abutting the semiconductor oxide based gate dielectric portion and comprising another polycrystalline semiconductor material, which is a portion of the doped polycrystalline semiconductor material layer 40; and a third polycrystalline semiconductor material portion vertically abutting the doped polycrystalline semiconductor material portion and comprising the polycrystalline semiconductor material, which is a portion of the polycrystalline semiconductor material layer 80.

Figure 17A:
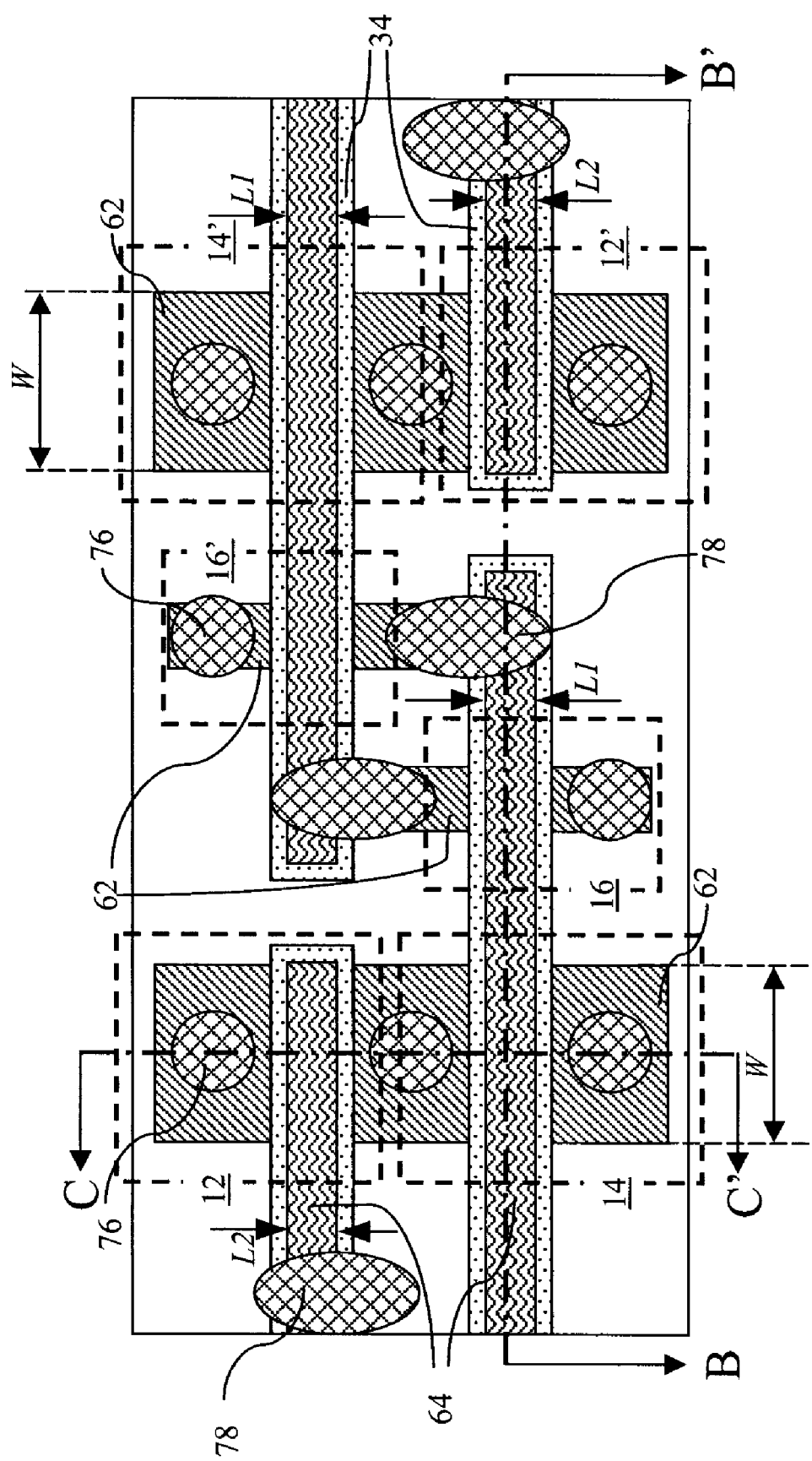
Figure 17B:
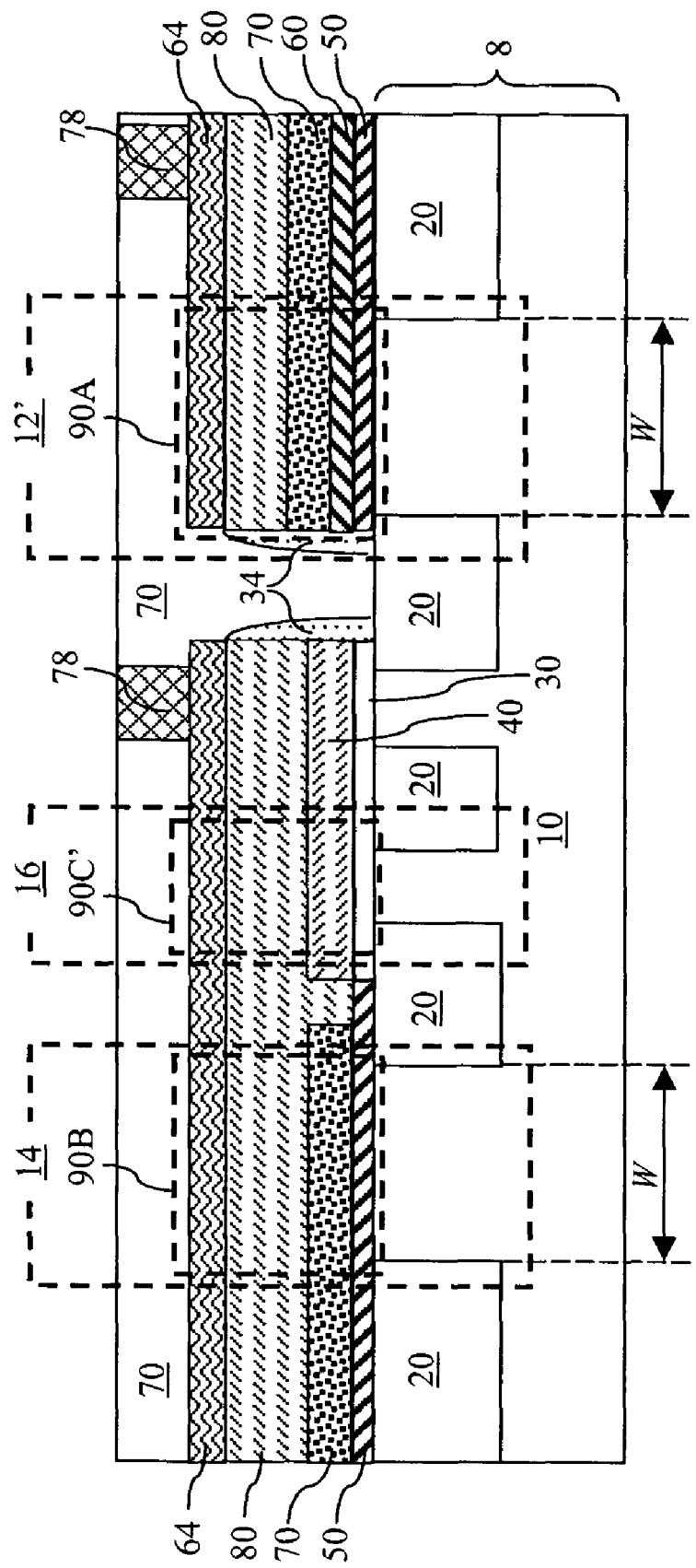
Figure 17C:
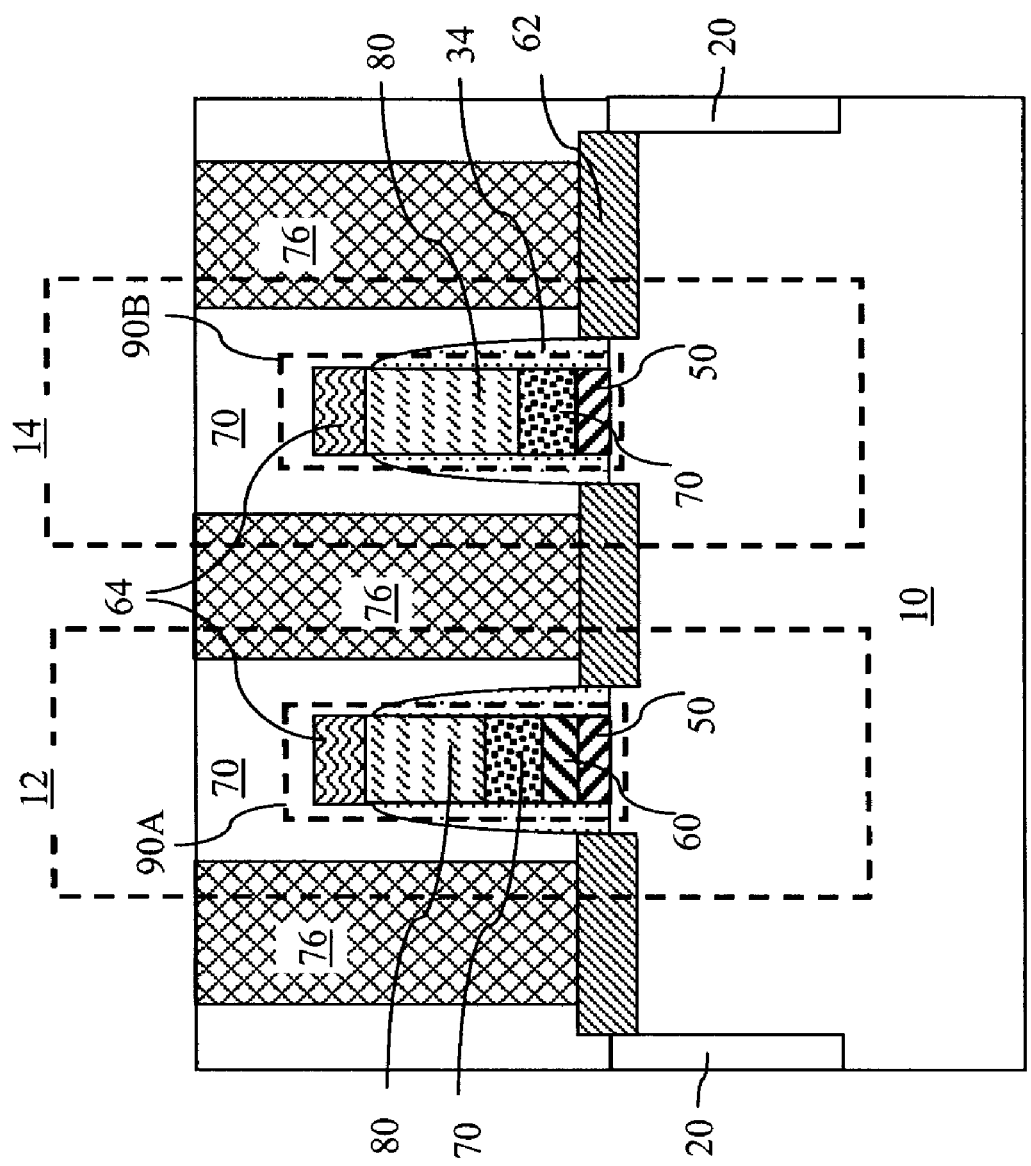
Figure 18A:
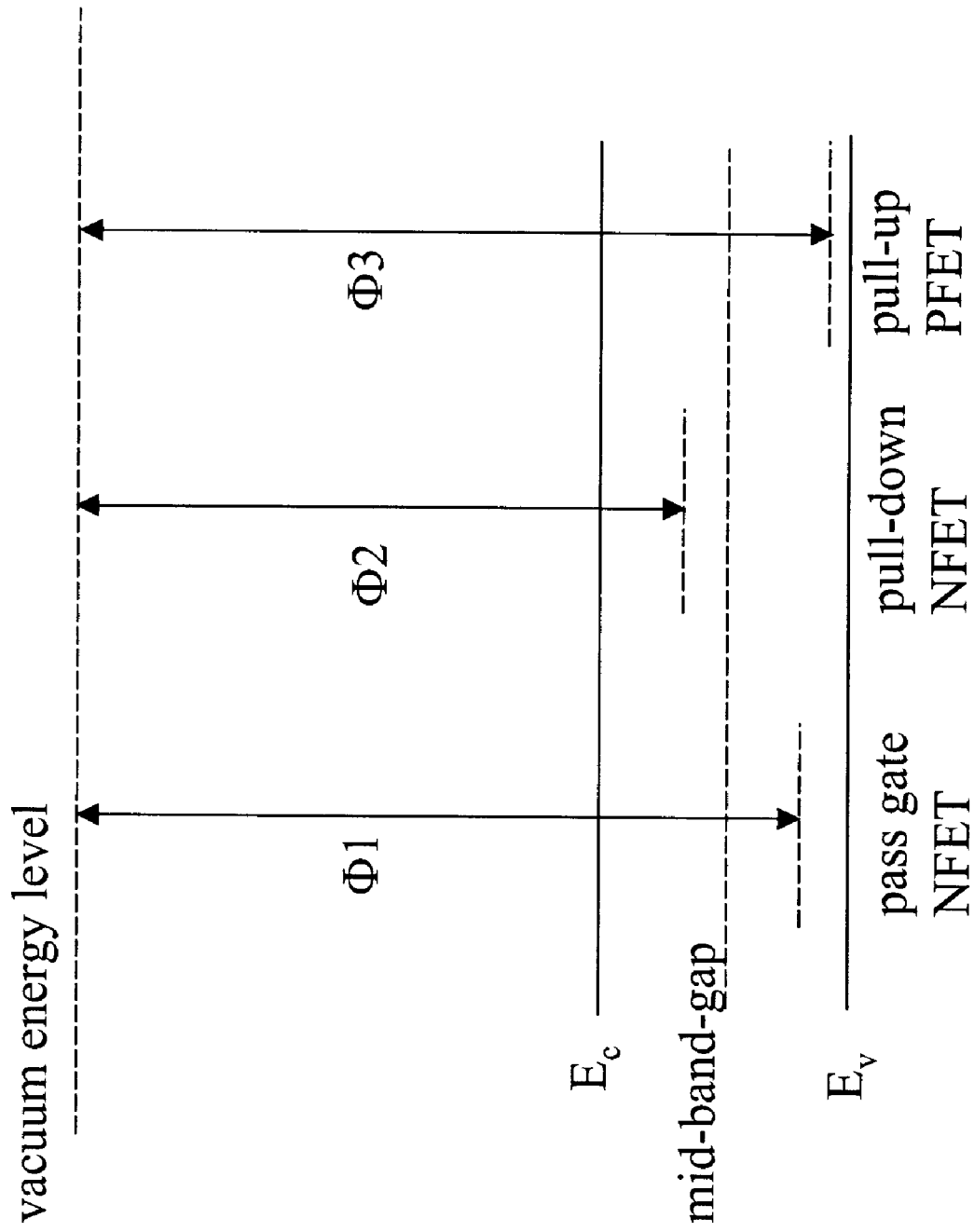
FIGS. 18A-18C are exemplary band gap diagrams showing work functions of various gate stacks according to the present invention.

Referring to FIG. 18A, a first exemplary band gap diagram is shown. A work function of a gate stack is the energy level required to move an electron of zero kinetic energy from a location in the gate stack to a vacuum energy level, or an energy level of zero total energy including the kinetic energy and the potential energy for an electron. The work function is the same as the magnitude of an effective Fermi level of the gate stack. According to the first embodiment and the second embodiment, the first work function $\Phi 1$, which is the work function of the first gate stack 90A, may be below or at the mid-band-gap level, which is the middle of the conduction band edge $E_c$ and the valence band edge $E_v$. The second work function $\Phi 2$, which is the work function of the second gate stack 90B, may be above the mid-band-gap level. Consequently, the first work function $\Phi 1$ is greater than the second work function $\Phi 2$. According to the first embodiment, the third work function $\Phi 3$, which is the work function of the third gate stack 90C (See FIGS. 10A-10C), is the same as the first work function $\Phi 1$. According to the second embodiment, the third work function $\Phi 3$, which is the work function of the third gate stack 90C' (See FIGS. 17A-17C), is greater than the second work function $\Phi 2$, and is preferably at a lower level than the mid-band-gap level in a band gap diagram, i.e., the third work function $\Phi 3$ is closer to the conduction band edge $E_c$ than the second work function $\Phi 2$.

Figure 18B:
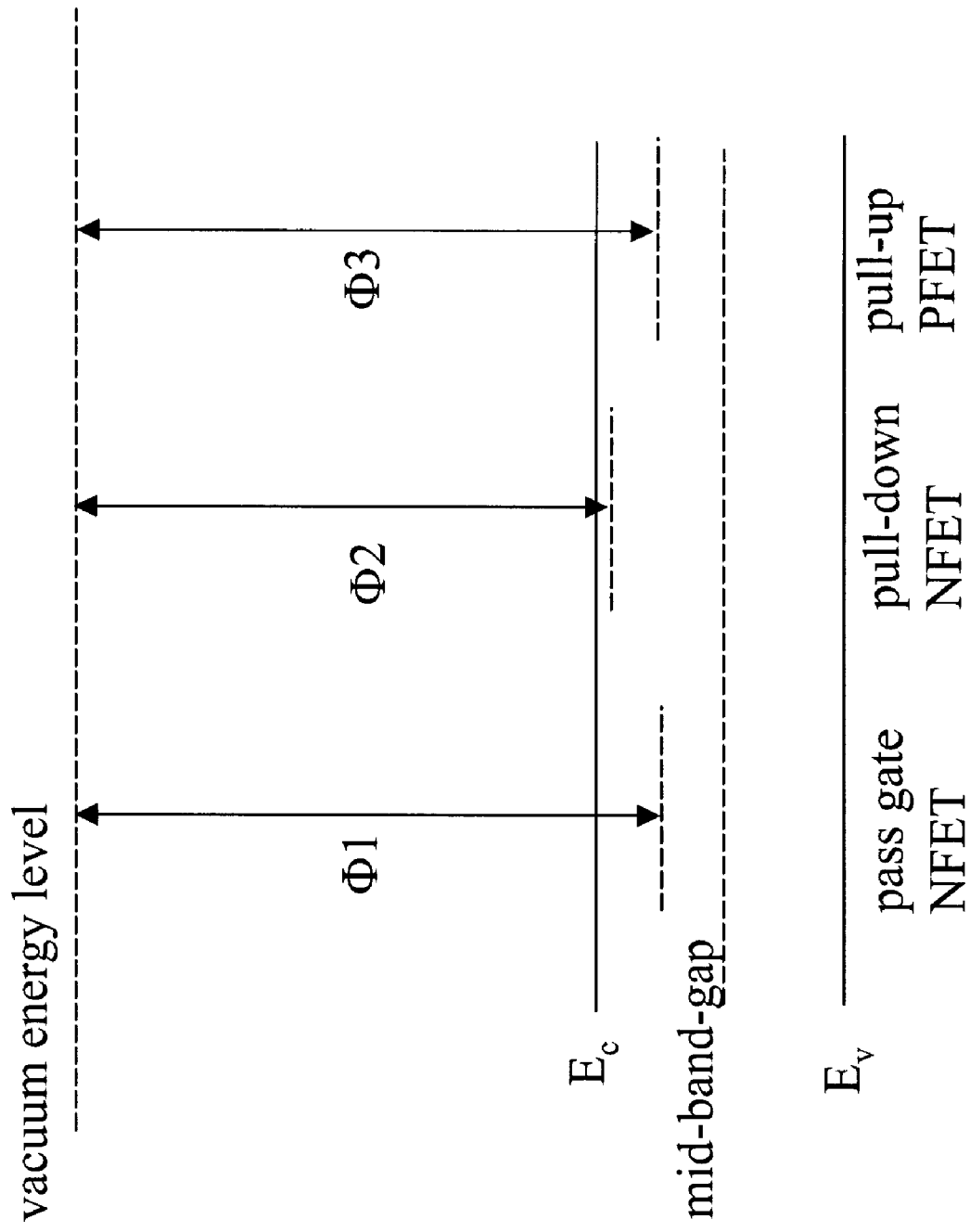

Referring to FIG. 18B, a second exemplary band gap diagram is shown. According to the first embodiment and the second embodiment, the first work function $\Phi 1$, which is the work function of the first gate stack 90A, may be below the conduction band edge $E_c$. The second work function $\Phi 2$ is below the conduction band edge $E_c$. The first work function $\Phi 1$ is greater than the second work function $\Phi 2$. According to the first embodiment, the third work function $\Phi 3$ is the same as the first work function $\Phi 1$. According to the second embodiment, the third work function $\Phi 3$ is at a lower level than the conduction band edge $E_c$ in a band gap diagram. Preferably, the third work function $\Phi 3$ is greater than the second work function $\Phi 2$, i.e., third work function $\Phi 3$ is closer to the conduction band edge $E_c$ than the second work function $\Phi 2$.

Figure 18C:
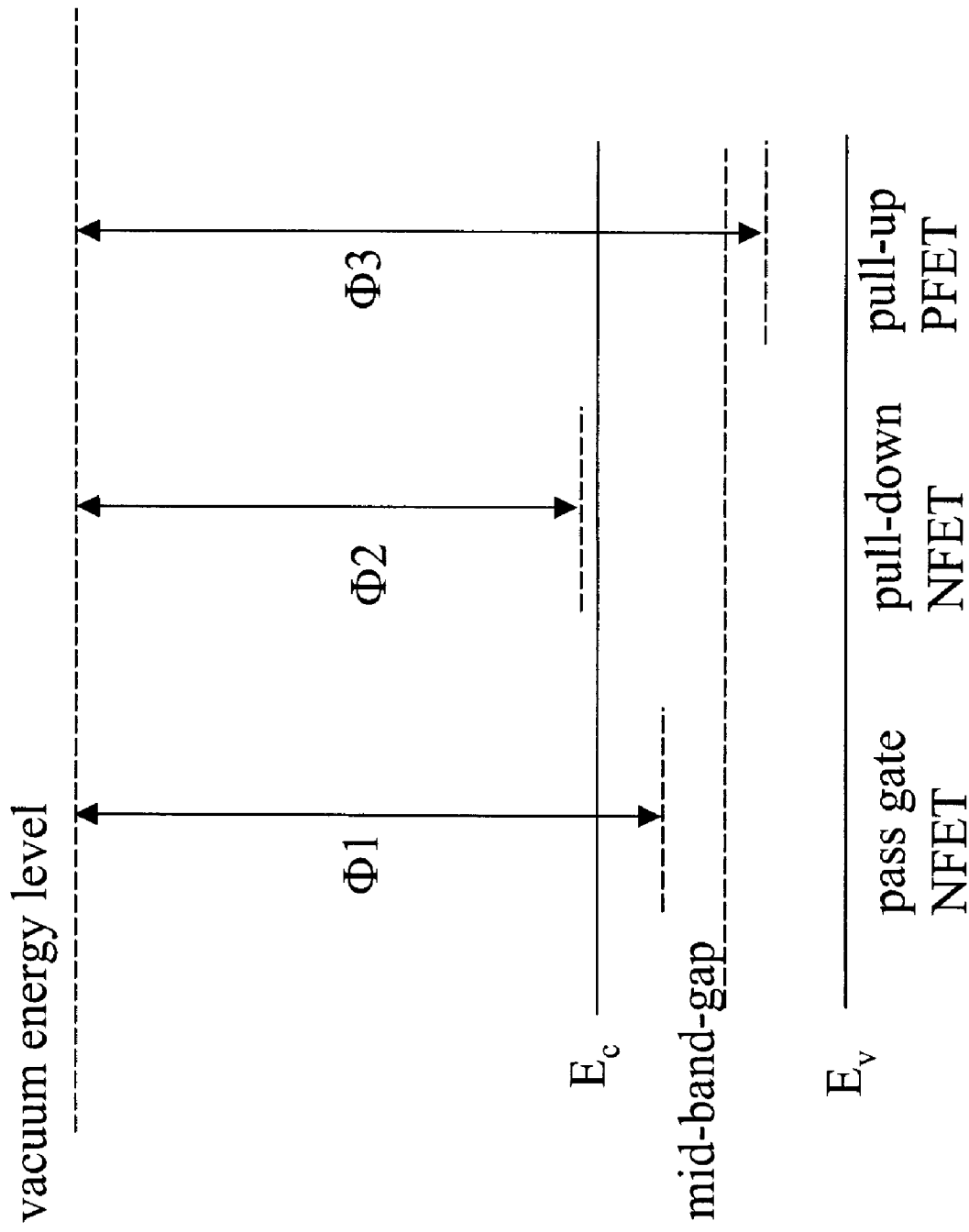

Referring to FIG. 18C, a third exemplary band gap diagram is shown. According to the first embodiment and the second embodiment, the first work function $\Phi 1$, which is the work function of the first gate stack 90A, may be below the conduction band edge $E_c$. The second work function $\Phi 2$ is above or at the conduction band edge $E_c$. Correspondingly, the first work function $\Phi 1$ is greater than the second work function $\Phi 2$. According to the first embodiment, the third work function $\Phi 3$ is the same as the first work function $\Phi 1$. According to the second embodiment, the third work function $\Phi 3$ is at a lower level than the conduction band edge $E_c$ in a band gap diagram. Preferably, the third work function $\Phi 3$ is greater than the second work function $\Phi 2$, i.e., third work function $\Phi 3$ is closer to the conduction band edge $E_c$ than the second work function $\Phi 2$.

The first work function $\Phi 1$ is always greater than the second work function $\Phi 2$ so that each of the first and second pass gate NFETs, which are formed in each of the first and second pass gate NFET region (12, 12') has less on-current per unit width than each of the first and second pull-down NFETs, which are formed in each of the first and second pull-down NFET region (14, 14'). Since each of the first and second pass gate NFETs and first and second pull-down NFET have the same width, which is the width W of the primary and secondary first active semiconductor areas (9A, 9B; See FIGS. 4A and 4B), the ratio of the on-current per unit width of each of the first and second pull-down NFETs to the on-current per unit width of each of the first and second pass gate NFETs is the beta ratio of the SRAM cell. Preferably, the beta ratio is from about 1.5 to about 2.5 to provide stability to operation of the SRAM cell. In order to achieve a beta value in such a range, the differences in the work function causes differences in threshold voltages between the first and second pull-down NFETs and the first and second pass gate NFETs. The difference in the threshold voltages is effected by presence or absence of a metal containing dielectric portion which is derived from the metal containing dielectric layer 60 in each gate stack. Thus, the metal containing dielectric layer 60 is a threshold voltage adjustment dielectric layer.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A static random access memory (SRAM) cell structure comprising:
    a planar pass gate n-type field effect transistor (NFET); and
    a planar pull-down NFET, wherein said planar pass gate NFET and said planar pull-down NFET are located on a common active semiconductor area having a substantially rectangular surface area, said common active semiconductor area being located in a semiconductor substrate, and wherein a first gate stack of said planar pass gate NFET has a first work function and a second gate stack of said planar pull-down NFET has a second work function, wherein said first work function is greater than said second work function.

2. The SRAM cell structure of claim 1, wherein a ratio of a first on-current of said planar pull-down NFET to a second on-current of said planar pass gate NFET is from about 1.5 to about 2.5.

3. The SRAM cell structure of claim 1, wherein a level of said first work function is below a mind-band-gap level and a level of said second work function is above said mid-band-gap level in a band gap diagram.

4. The SRAM cell structure of claim 1, wherein a first gate length of said planar pass gate NFET and a second gate length of said planar pull-down NFET are the same.

5. The SRAM cell structure of claim 4, further comprising a planar pull-up p-type field effect transistor (PFET), wherein a third gate length of said planar pull-up PFET is the same as said first gate length.

6. A static random access memory (SRAM) cell structure comprising:
- a planar pass gate n-type field effect transistor (NFET); and
- a planar pull-down NFET, wherein said planar pass gate NFET and said planar pull-down NFET are located on a common active semiconductor area having a substantially rectangular surface area, said common active semiconductor area being located in a semiconductor substrate, wherein said planar pass gate NFET comprises a first gate stack and said planar pull-down NFET comprises a second gate stack, wherein said first gate stack comprises:
  - a first high dielectric constant (high-k) material portion comprising a high-k material having a dielectric constant greater than 4.0;
  - a metal containing dielectric portion vertically abutting said first high-k material portion and comprising a different material than said high-k material; and
  - a first conductive metal nitride portion vertically abutting said metal containing dielectric portion and comprising a conductive metal nitride;
- and wherein said second gate stack comprises:
  - a second high-k material portion comprising said high-k material; and
  - a second conductive metal nitride portion vertically abutting said second high-k material portion and comprising said conductive metal nitride.

7. The SRAM cell structure of claim 6, further comprising a planar pull-up p-type field effect transistor (PFET) located on an active area of said semiconductor substrate and containing a third gate stack, said third gate stack comprising:
- a third high-k material portion comprising said high-k material;
- a second metal containing dielectric portion vertically abutting said third high-k material portion and comprising a same material as said metal containing dielectric portion; and
- a third conductive metal nitride portion vertically abutting said second metal containing dielectric portion and comprising said conductive metal nitride.

8. The semiconductor structure of claim 6, wherein said first gate stack further comprises a first polycrystalline semiconductor material portion vertically abutting said first conductive metal nitride portion and comprising a polycrystalline semiconductor material, and wherein said second gate stack further comprises a second polycrystalline semiconductor material portion vertically abutting said second conductive metal nitride portion and comprising said polycrystalline semiconductor material.

9. The SRAM cell structure of claim 8, wherein said polycrystalline semiconductor material comprises doped silicon, a doped silicon germanium alloy, a doped silicon carbon alloy, or a doped silicon germanium carbon alloy.

10. The SRAM cell structure of claim 8, further comprising a planar pull-up p-type field effect transistor (PFET) located on an active area of said semiconductor substrate and containing a third gate stack, said third gate stack comprising:
- a semiconductor oxide based gate dielectric portion comprising a semiconductor oxide or a semiconductor oxynitride;
- a doped polycrystalline semiconductor material portion vertically abutting said semiconductor oxide based gate dielectric portion and comprising another polycrystalline semiconductor material; and
- a third polycrystalline semiconductor material portion vertically abutting said doped polycrystalline semiconductor material portion and comprising said polycrystalline semiconductor material.

11. A static random access memory (SRAM) cell structure comprising:
- a planar pass gate n-type field effect transistor (NFET); and
- a planar pull-down NFET, wherein said planar pass gate NFET and said planar pull-down NFET are located on a common active semiconductor area having a substantially rectangular surface area, said common active semiconductor area being located in a semiconductor substrate,
- wherein said planar pass gate NFET comprises a second gate stack and said planar pull-down NFET comprises a first gate stack, wherein said first gate stack comprises:
  - a first high dielectric constant (high-k) material portion comprising a high-k material having a dielectric constant greater than 4.0;
  - a metal containing dielectric portion vertically abutting said first high-k material portion and comprising a different material than said high-k material; and
  - a first conductive metal nitride portion vertically abutting said metal containing dielectric portion and comprising a conductive metal nitride;
- and wherein said second gate stack comprises:
  - a second high-k material portion comprising said high-k material; and
  - a second conductive metal nitride portion vertically abutting said second high-k material portion and comprising said conductive metal nitride.

* * * * *